United States Patent
Kamitani et al.

(10) Patent No.: US 7,586,734 B2
(45) Date of Patent: Sep. 8, 2009

(54) ELECTROSTATIC CHUCK

(75) Inventors: Satoru Kamitani, Kirishima (JP); Kiyoshi Yokoyama, Kirishima (JP)

(73) Assignee: Kyocera Corporation, Kyoto (JP)

( * ) Notice: Subject to any disclaimer, the term of this patent is extended or adjusted under 35 U.S.C. 154(b) by 296 days.

(21) Appl. No.: 11/571,347

(22) PCT Filed: Jun. 27, 2005

(86) PCT No.: PCT/JP2005/011743

§ 371 (c)(1),
(2), (4) Date: Dec. 27, 2006

(87) PCT Pub. No.: WO2006/001425

PCT Pub. Date: Jan. 5, 2006

(65) Prior Publication Data

US 2008/0037194 A1    Feb. 14, 2008

(30) Foreign Application Priority Data

Jun. 28, 2004  (JP) ............................. 2004-190461
Jun. 28, 2004  (JP) ............................. 2004-190462

(51) Int. Cl.
*H01T 23/00* (2006.01)
(52) U.S. Cl. ....................... 361/234; 361/230
(58) Field of Classification Search .......... 361/230–234
See application file for complete search history.

(56) References Cited

U.S. PATENT DOCUMENTS

| | | | |
|---|---|---|---|
| 5,530,616 A | 6/1996 | Kitabayashi et al. | 361/234 |
| 5,777,838 A | 7/1998 | Tamagawa et al. | 361/234 |
| 5,886,863 A | 3/1999 | Nagasaki et al. | 361/234 |
| 5,986,874 A * | 11/1999 | Ross et al. | 361/234 |
| 6,028,762 A * | 2/2000 | Kamitani | 361/234 |
| 6,785,115 B2 | 8/2004 | Tsuruta et al. | 361/234 |
| 6,863,281 B2 | 3/2005 | Endou et al. | 279/128 |
| 2004/0055709 A1* | 3/2004 | Boyd et al. | 156/345.51 |
| 2004/0117977 A1* | 6/2004 | Hiramatsu et al. | 29/611 |

FOREIGN PATENT DOCUMENTS

| | | |
|---|---|---|
| JP | 07-153825 | 6/1995 |
| JP | 09-069555 | 3/1997 |
| JP | 09-172055 | 6/1997 |
| JP | 2002-170868 | 6/2002 |
| JP | 2002-222851 | 8/2002 |
| JP | 2003-086664 | 3/2003 |

* cited by examiner

*Primary Examiner*—Danny Nguyen
(74) *Attorney, Agent, or Firm*—Hogan & Hartson LLP

(57) ABSTRACT

An electrostatic chuck having a good soaking feature and allowing a wafer to reach a saturation temperature quickly is provided. The chuck, which has a platy body with a pair of main surfaces, one main surface being used as a mounting surface for mounting a wafer, and an attracting electrode on the other main surface or inside the body, has at least one gas introducing through hole formed so as to pass through the body, a gas flow path formed in the mounting surface by a plurality of mutually separated protrusions and formed so as to communicate with the through hole, and an annular wall portion formed on the outer periphery of the body, characterized in that the planar shape of each of the above protrusions consists of four sides and arc-shaped portions connecting the four sides, and the above protrusions are uniformly arranged on the mounting surface.

16 Claims, 6 Drawing Sheets

ELECTROSTATIC CHUCK

TECHNICAL FIELD

The present invention relates to an electrostatic chuck used to support semiconductor wafers by electrostatic force in semiconductor manufacturing process, or to support liquid crystal substrates in flat panel display manufacturing process.

BACKGROUND ART

Electrostatic chucks have been used to hold wafers by electrostatic attraction force in the etching step to form fine patterns on the semiconductor wafers (hereinafter referred to as a wafer) and the film forming step to form thin films, in the semiconductor manufacturing process.

The electrostatic chuck comprises a dielectric layer, a top surface of which is used as a mounting surface whereon a wafer is attracted and mounted, and an electrostatic attraction electrode provided on the bottom surface of the dielectric layer, wherein a voltage is applied between the wafer and the electrostatic attraction electrode so as to generate electrostatic attraction force and thereby hold the wafer on the mounting surface.

When manufacturing semiconductors today, it is required to etch the wafer at a constant etching rate throughout the wafer surface and form the thin film with uniform thickness. This makes it necessary to keep the wafer at a constant temperature and minimize the temperature difference across the wafer surface. In recent years, with the rapid growth of the semiconductor industry, demand has been increasing for processing a larger number of wafers per unit time, and it is required to shorten the time taken to heat the wafer to the saturation temperature.

Japanese Unexamined Patent Publication No. 9-172055 proposes an electrostatic chuck having a plurality of tiny protrusions, each tapering off from the base toward the tip thereof, provided on the mounting surface so that a wafer is held via point contacts at the tips of the protrusions, in order to put the wafer into contact with a gas heating the wafer through larger area and thereby heat the wafer uniformly.

Japanese Unexamined Patent Publication No. 2002-222851 describes that by decreasing the contact area between the wafer and the electrostatic chuck surface and decreasing the height of the protrusions, it is possible to attract the wafer by the force exerted not only by the contact portion but also by other portions, thereby resulting in that the wafer can be held by a larger force with a smaller contact area and the wafer can be heated uniformly.

With the electrostatic chucks described in Japanese Unexamined Patent Publication No. 9-172055 and Japanese Unexamined Patent Publication No. 2002-222851, however, the contact area between the wafer and the electrostatic chuck is too small and the wafer can be lifted of the electrostatic chuck by the pressure of a gas which is caused to flow through a gas flow passage of the electrostatic chuck in the case of an electrostatic chuck that utilizes weak Coulomb force, although it does not cause a problem in the case of electrostatic chuck that utilizes Johnson Rahbeck effect which exerts larger attraction force. If the gas pressure is decreased so that the wafer would not be lifted off the electrostatic chuck, it takes a longer time to heat the wafer to the saturation temperature, thus decreasing the number of wafers which can be processed per unit time.

In order to increase the contact area between the wafer and the mounting surface so that the wafer would not be lifted off the electrostatic chuck, Japanese Unexamined Patent Publication No. 2002-170868 describes an electrostatic chuck which is capable of heating a wafer to the saturation temperature in a shorter time and achieve uniform temperature distribution at the saturation temperature, with such a constitution as the electrostatic chuck has a plurality of gas grooves disposed to run in the radial directions at equal intervals, a plurality of annular grooves disposed in concentric circles in communication with the radial grooves, and at least one separating groove extending in the radial direction so as to divide each mounting surface region, surrounded by two annular grooves and two radial grooves, located outward from the annular groove that is nearest to the center, into two parts, wherein the mounting surface region surrounded by two adjacent annular grooves and two adjacent radial grooves, mounting surface region surrounded by two adjacent annular grooves, one radial groove and one separation groove and mounting surface region surrounded by two adjacent annular grooves and two separation grooves have substantially the same area.

Japanese Unexamined Patent Publication No. 7-153825 discloses an electrostatic chuck having protrusions of circular shape disposed in a grating pattern on the wafer mounting surface.

DISCLOSURE OF THE INVENTION

With the electrostatic chuck described in Japanese Unexamined Patent Publication No. 2002-170868, although the wafer is not lifted off the electrostatic chuck when a gas flows through the gas flow passage due to the large area of contact with the wafer, the gas cannot flow smoothly at a branching point of the groove and therefore it is not possible to meet the requirement of uniform heating which is increasing recently, thus failing to reduce the time before the wafer reaches the saturation temperature. According to Japanese Unexamined Patent Publication No. 7-153825, although the gas flows smoothly in directions b and c in FIG. 5 as the protrusions have circular shape in top view as shown in FIG. 5, the gas cannot flow smoothly in direction a, thus taking longer time before the wafer reaches the saturation temperature in the peripheral region.

There is also such a problem that, when the gas flow passage is increased so to improve the uniformity of heating with such an electrostatic chuck as described above, increased gas flow passage results in a decreasing area of contact with the wafer, which decreases the force of the electrostatic chuck to attract the wafer. In order to increase the attracting force without making the gas flow passage smaller, it is necessary to apply a high voltage to the electrode embedded in the electrostatic chuck. However, repeating the impression and open cycles of a high voltage may cause insulation breakdown of the dielectric layer of the electrostatic chuck.

An object of the present invention is to provide an electrostatic chuck which is capable of heating a wafer to the saturation temperature in a shorter period of time with satisfactorily uniform temperature distribution, and has high durability against voltage impression cycles.

The present inventors have intensively studied to solve the problems described above, and completed the present invention based on the finding described below. In an electrostatic chuck having a gas flow passage comprising a plurality of protrusions disposed in a grating pattern, forming the protrusions in rectangular shape makes it difficult for the gas introduced through the through-hole to spread in a direction traversing the direction of flow while forming the protrusions in circular shape makes it easy for the gas introduced through the through-hole to spread in a direction traversing the direction of flow but difficult to spread in the direction of flow, and uniform heating cannot be achieved in either case, but the gas can be distributed uniformly so as to decrease the time taken to reach the saturation temperature and improve the uniformity of heating by forming the protrusions in rectangular shape having rounded corners.

A first aspect of the present invention is an electrostatic chuck comprising: a plate-like member having a pair of main surfaces, one of the main surfaces serving as a wafer mounting surface; and an electrostatic attraction electrode provided on the other main surface of the plate-like member or inside of the plate-like member, the plate-like member comprising at least one gas introducing through-hole formed so as to penetrate through the plate-like member, a gas flow passage for communicating with the through-hole, being formed between a plurality of protrusions disposed at distance from each other on the mounting surface, and a ring-shaped wall formed along the periphery of the plate-like member, wherein each of the protrusions has a planar configuration comprising four sides and four arced corners connecting the four sides, and all the protrusions are disposed substantially evenly on the mounting surface so that a gas introduced through the gas introducing through-hole is diffused uniformly.

In the electrostatic chuck of the present invention, it is preferable that the protrusions are disposed in a grating pattern on the mounting surface. By disposing the protrusions in a grating pattern, it is made possible to cause the gas introduced through the gas introducing through-hole to be diffused uniformly thereby heating the wafer uniformly.

It is preferable that portions connecting a bottom of the gas flow passage with the protrusions or the ring-shaped wall are formed to be arced. By forming in such a configuration, it is made possible to cause the gas introduced through the through-hole to be easily diffused laterally with respect to the substrate thereby heating the wafer uniformly.

The electrostatic chuck of the present invention is characterized in that arithmetic mean surface roughness Ra of the bottom surface of the gas flow passage is 2 μm or less. By controlling the arithmetic mean surface roughness Ra to 2 μm or less, it is made possible to make the bottom surface of the gas flow passage smoother so that the gas of a low pressure can smoothly diffuse in the gas flow passage, thereby reducing the time taken to heat the wafer W surface to the saturation temperature and minimize the temperature difference across the wafer surface.

The electrostatic chuck of the present invention is also characterized in that width of the ring-shaped wall is from 0.5 to 10 mm, distance between opposing sides of the protrusion is from 1.5 to 10 mm, total area of the top surfaces of the protrusions and of the ring-shaped wall is from 50 to 80% of the area of the mounting surface, and the height of the protrusion from a bottom surface of the gas flow passage is from 10 to 100 μm. By providing the contact area in a proportion from 50 to 80%, it is made possible to prevent the wafer from being lifted off the electrostatic chuck and prevent the temperature difference across the wafer surface from increasing due to decreasing region of gas flow. When the height of the protrusion from the bottom surface of the gas flow passage is controlled within a range from 10 to 100 μm, the gas can be distributed smoothly throughout the mounting surface, and insulation breakdown can be prevented from occurring due to the voltage applied between the wafer and the electrode.

It is preferable that one through-hole is provided at the center of the mounting surface and more than one through-hole is provided on a concentric circle about the center of the mounting surface. With this constitution, it is made possible to supply the gas throughout the mounting surface in a shorter period of time and decrease the time taken to heat the wafer W to the saturation temperature in equilibrium.

The electrostatic chuck according to the present invention is also characterized in that the ring-shaped walls are provided along the periphery of the mounting surface and at a position located inside the ring-shaped walls, while a plurality of through-holes are provided between the outer ring-shaped wall and the inner ring-shaped wall, and through-holes are provided at a position inside the inner ring-shaped wall. By supplying the gas through the through-holes provided between the outer ring-shaped wall and the inner ring-shaped wall and the through-holes provided at a position inside the inner ring-shaped wall while adjusting the flow rates in the individual holes, it is made possible to control the heat transfer between the mounting surface and the wafer in the inner area of the mounting surface and in the area along the periphery, thereby minimizing the temperature difference across the wafer surface.

It is preferable that maximum diameter of the plate-like member is from 180 to 500 mm, and the number of the through-holes is from 4 to 100 each measuring 0.1 to 5 mm in diameter. This constitution makes it possible to distribute the gas uniformly in the gas flow passage, thereby to decrease the time taken to heat the wafer to the saturation temperature and improve the uniformity of heating.

It is preferable to install a heat exchanger on the other main surface of the plate-like member. The heat exchanger can efficiently absorb heat of the plate-like member through the mounting surface, thereby suppressing the temperature of the wafer from rising.

The heat exchanger is preferably constituted from a metal plate. By using a metal plate as the heat exchanger, it is made possible to absorb the heat through the mounting surface most efficiently.

In the electrostatic chuck of the present invention, the plate-like member is preferably made of a sintered material comprising alumina or aluminum nitride as a main component, since such a material has high resistance to plasma.

Also the present inventors have intensively studied to solve the problem that subjecting the electrode embedded in the electrostatic chuck to repetitive cycles of the impression and open of a high voltage may lead to insulation breakdown of the dielectric layer of the electrostatic chuck. The present invention was completed through the following findings which were obtained in the research. The open porosity in the dielectric layer has an influence on the durability to repetitive voltage impression and open cycles. When the open porosity in the dielectric layer is 1% or less, the dielectric layer sandwiched by the mounting surface and the electrode would not undergo insulation breakdown even when the impression and open of voltage are repeated over a long period of time, thus achieving improved durability against the cycle. Durability to the voltage impression and open cycles can also be improved by controlling the mean distance between the electrode and the wafer mounting surface to 0.015 cm or more, setting the product of the mean distance and specific volume resistivity of the dielectric layer sandwiched by the mounting surface and the electrode within a range from $1 \times 10^7$ to $5 \times 10^{16}$ $\Omega \cdot cm^2$, and controlling the mean particle size of aluminum nitride used in forming the dielectric layer in a range from 1 to 20 μm.

Accordingly a second aspect of the present invention is an electrostatic chuck comprising the plate-like member made of a dielectric material comprising aluminum nitride as a main component, where mean distance between the electrode and the wafer mounting surface is 0.015 cm or more, the product of the mean distance and specific volume resistivity of the dielectric layer sandwiched by the mounting surface and the electrode is in a range from $1 \times 10^7$ to $5 \times 10^{16}$ $\Omega \cdot cm^2$, mean grain size of aluminum nitride used in forming the dielectric layer is in a range from 1 to 20 µm and a open porosity in the dielectric layer is 1% or less.

The electrostatic chuck of the present invention is characterized in that the dielectric layer includes pores located in crystal grains and pores located in grain boundaries, and that mean size of the grain boundary pores is smaller than the mean crystal grain size of aluminum nitride. By controlling the mean size of the grain boundary pores to be smaller than the mean crystal grain size of aluminum nitride, it is made possible to suppress the open porosity and thereby make the electrostatic chuck having the dielectric layer which would not undergo insulation breakdown even when the cycles of impression and open of voltage are repeated.

The electrostatic chuck according to the present invention is characterized in that a ratio Sg/Sc of a proportion Sg of the grain boundary pores to a proportion Sc of the in-grain pores in the dielectric layer is not higher than 1.0. When the ratio Sg/Sc is higher than 1.0, higher proportion of the grain boundary pores causes the aluminum nitride grains to come off during machining process, thus resulting in increasing open porosity.

It is preferable that the dielectric layer is containing aluminum nitride as a main component and 0.2 to 15% by weight of oxide of group 3a metal element is included as an auxiliary component. Specific volume resistivity can be set to a desired value by controlling the content of the auxiliary component in the range from 0.2 to 15% by weight.

The group 3a metal described above is preferably cerium. Cerium has the highest durability to voltage impression and open cycles.

The electrostatic chuck according to the present invention is characterized in that the plate-like ceramic member made of aluminum nitride is formed by sintering at a temperature from 1800 to 1900° C. in non-oxidizing atmosphere of 0.2 to 200 MPa for a period of 0.5 to 20 hours. By firing under these conditions, it is made possible to make the electrostatic chuck comprising the dielectric layer having the desired values of mean particle size and open porosity.

EFFECT OF THE INVENTION

As described above, the electrostatic chuck of the present invention comprises a plate-like member of which one of the main surfaces serves as a wafer mounting surface, and an electrostatic attraction electrode is provided either on the other main surface or inside of the plate-like member, wherein the through-holes, a plurality of protrusions, the ring-shaped wall running along the periphery and the gas flow passage running between the protrusions are formed on one of the main surfaces of the plate-like member, while the protrusion has a configuration constituted from four sides and four arced corners that connect the four sides in plan view, and the protrusions are disposed evenly on the mounting surface so that a gas introduced through the through-hole can be distributed uniformly in the direction of flow and in the direction transverse to the direction of flow in an appropriate proportion, thereby making it possible to decrease the time taken to reach the saturation temperature and improve the uniformity of heating.

BRIEF DESCRIPTION OF THE DRAWINGS

FIG. 1b is a sectional view taken along line X-X of FIG. 1a.

FIG. 2b is a sectional view taken along lines X-X of FIG. 2a.

FIG. 3b is a sectional view taken along lines X-X of FIG. 3a.

BEST MODE FOR CARRYING OUT THE INVENTION

The electrostatic chuck of the present invention will now be described.

Figure 1A:
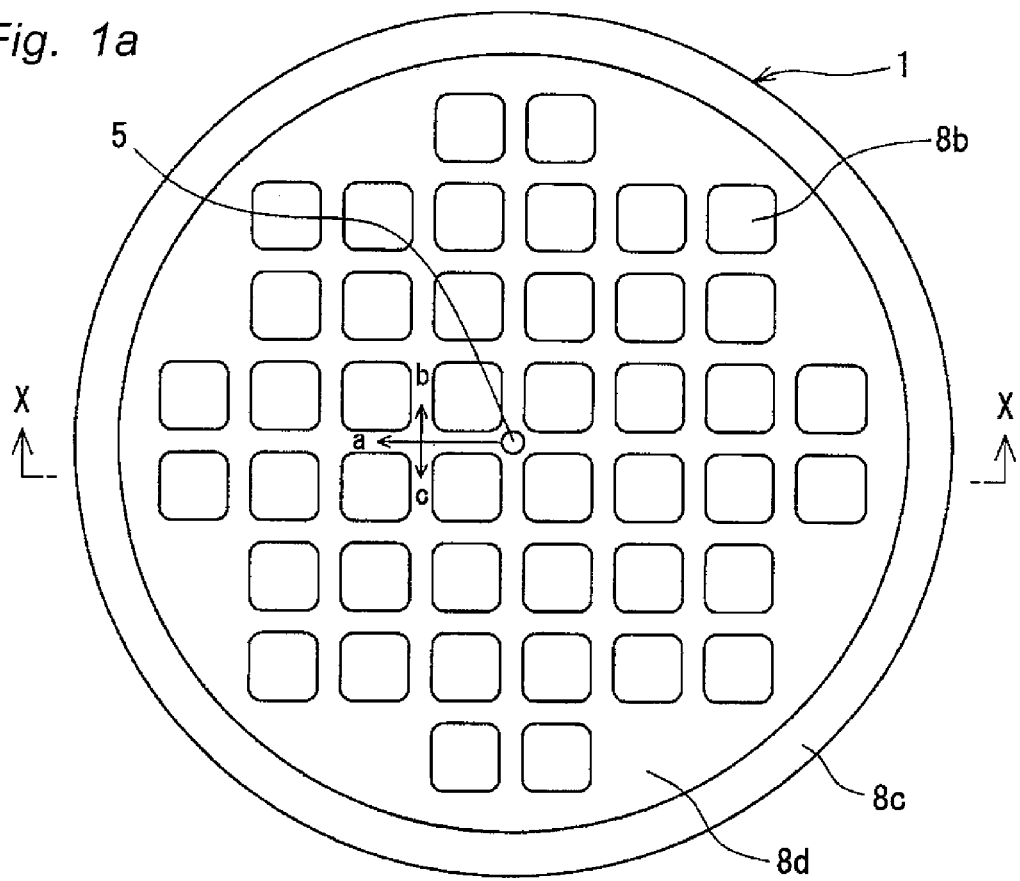
FIG. 1a is a schematic plan view showing an electrostatic chuck of the present invention.
Figure 1B:
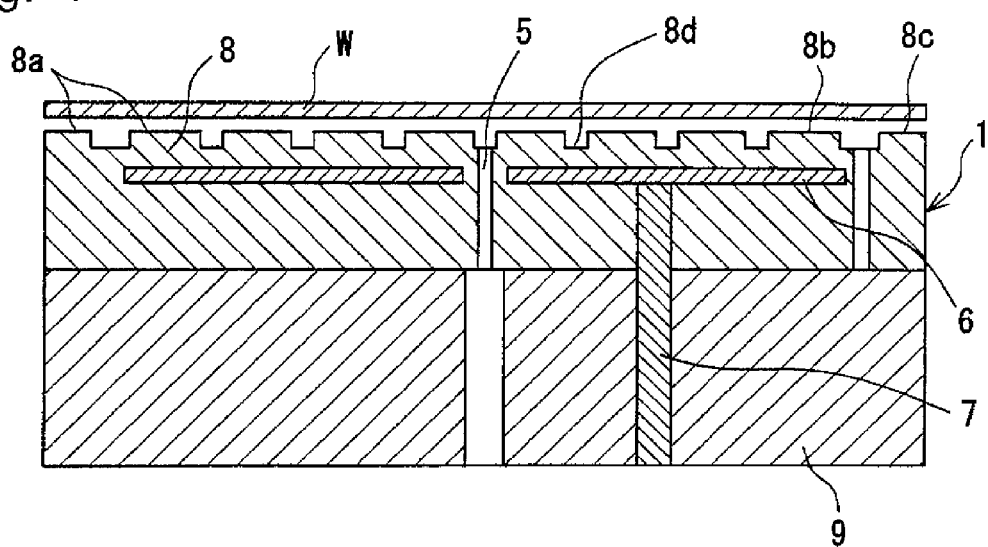

FIG. 1 is a schematic view showing an example of the electrostatic chuck 1 of the present invention. The electrostatic chuck 1 has an attracting electrode 6 provided in the plate-like member 8, where one of the main surfaces of the plate-like member 8 serves as a wafer W mounting surface 8a and a power feeding terminal 7 connected to the electrode 6 is provided on the other main surface of the plate-like member 8. A heat exchanger 9 is bonded onto the other main surface of the plate-like member 8 as required.

Through-hole 5 is provided on one of the other main surface of the plate-like member 8, so as to supply a gas such as He through the through-hole 5 and cause the gas to flow through the gas flow passage 8d and fill the space formed by the wafer W and the mounting surface 8a.

The electrostatic chuck 1 is placed in a vessel not shown in the drawing of which inside pressure is reduced, where the wafer W is placed on the mounting surface 8a so that the wafer W can be attracted by applying a voltage to the electrostatic attraction electrode 6. Then with argon gas or the like introduced into the vessel of which inside pressure is reduced, plasma is generated above the wafer W so that the wafer W can be etched or a film can be formed thereon.

The wafer W is heated by the plasma, and temperature of the mounting surface 8a rises. The gas is supplied through the through-hole 5 into the gas flow passage 8d of the electrostatic chuck 1, so as to increase the heat transfer between the mounting surface 8a and the wafer W and dissipate the heat, and temperature of the mounting surface 8a can be made uniform.

While the gas supplied through the through-hole 5 fills the space formed by the ring-shaped wall 8c provided along the periphery of the plate-like member 8, the gas flow passage 8d and the wafer W, a small mount of gas leaks into the vessel through a gap between the ring-shaped wall 8c and the wafer W. However, the structure is such that the gas leakage out of the electrostatic chuck 1 does not affect the film forming process on the wafer W. Pressure of the gas is set to a constant level that is weaker than the attracting force of the electrostatic chuck 1, so that the wafer W would not be lifted off the electrostatic chuck 1 by the gas pressure.

The protrusion 8b has a shape constituted from four sides and four arced corners that connect the four sides in plan view on a plane of projection of the electrostatic chuck 1 onto the mounting surface 8a, and the protrusions 8b are evenly distributed on the mounting surface 8a. The protrusions 8b have more preferably substantially square shape.

The phrase "evenly distributed" means an arrangement at substantially equal intervals except for areas around the through-hole and the ring-shaped wall. Shape of the arced corner may be a part of circle, ellipse, hyperbola, spline curve or the like.

Figure 3A:
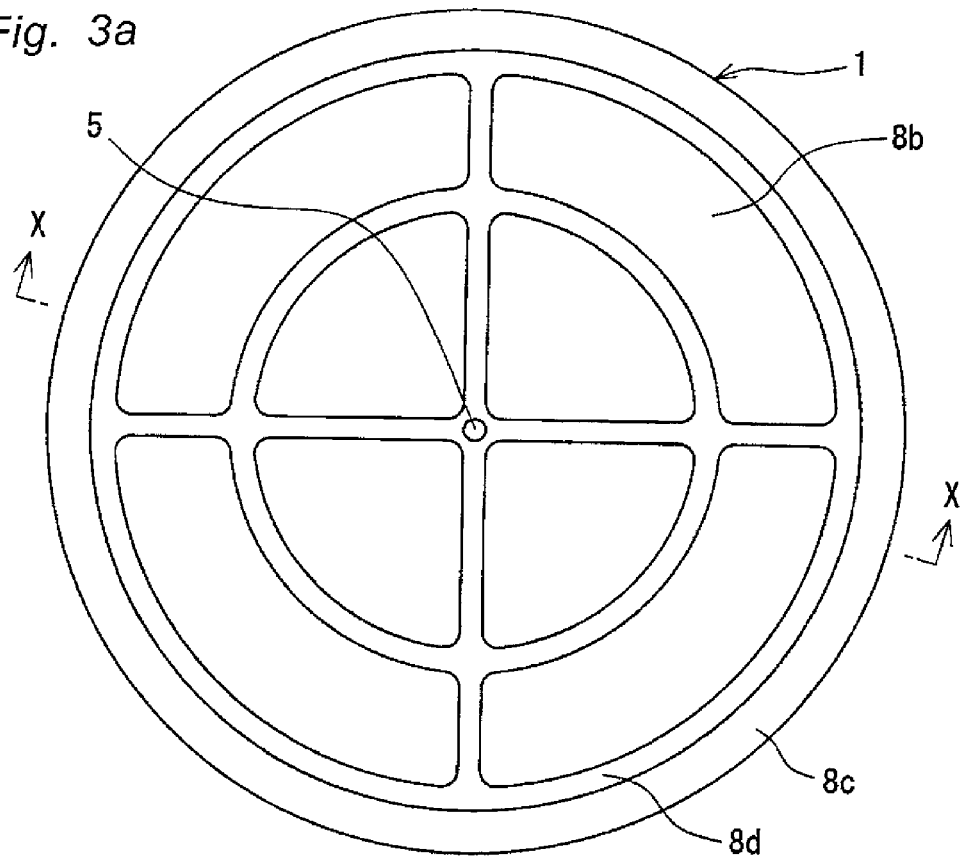
FIG. 3a is a schematic plan view showing another electrostatic chuck of the present invention.
Figure 3B:
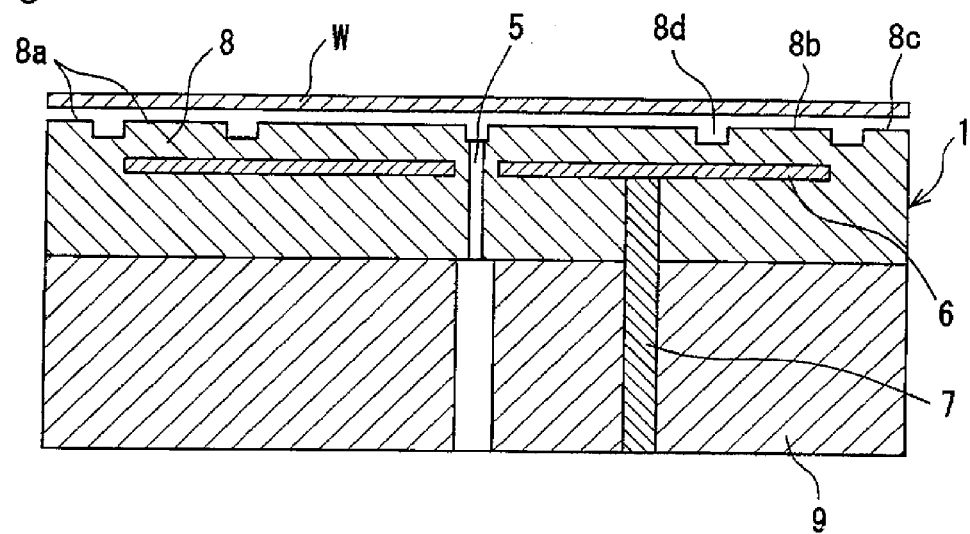

The gas supplied through the through-hole 5 flows through the straight gas flow passage in the direction a smoothly up to the periphery, for example, as shown in FIG. 1. Configuration of the protrusion 8b constituted from the four sides and the arced corners that connect the four sides is preferable since it allows the gas to flow smoothly also in the directions b and c. This makes it possible for the gas supplied through the through-hole 5 to flow through the gas flow passage 8d and spread over the entire surface on the back of the wafer in a shorter period of time. As a result, it is made possible to decrease the time taken to heat the wafer W to the saturation temperature in equilibrium with minimum temperature difference across the wafer W surface. For the above reason, the shape of the protrusion 8b surrounded by the four sides is most preferably square, but also may be a fan shape as shown in FIG. 3. It is preferable that the protrusions 8b are arranged in a pattern symmetrical with respect to the center of the mounting surface 8a as shown in FIG. 3, since it causes the gas to spread evenly from the center toward the periphery and minimizes temperature difference across the surface of the wafer W. Shape of the protrusions 8b may also be rectangular or rhombic, in accordance to the shape of the semiconductor device.

It was found that the shape of the protrusion of the present invention, which is constituted from the four sides and the arced corners which connect the former, has an advantage of making it possible to achieve uniform thickness and characteristics of the semiconductor chips which are manufactured with increasingly larger sizes in recent years. This advantage is attributed to the fact that, while it is required to achieve the distributions of temperature and attracting force of the wafer W that are symmetrical with respect to the center, for large-sized chips it is also important to achieve uniformity within each of the rectangular chips. By achieving uniform thickness and characteristics of the chips, it is made possible to produce more devices of excellent electrical characteristics from one wafer W thereby improving the yield of production.

The arced corners described above are preferably R shape of circular arcs, of a size from 0.1 to 2 mm. By controlling the size in this range, it is made possible to form uniform gas flows in the directions of a, b and c, shorten the time taken to heat the wafer W to the saturation temperature, minimize temperature difference across the surface of the wafer W and improve the uniformity of heating. When size of the R shape of the arced corner is smaller than 0.1 mm, the gas flows smoothly in the direction a in FIG. 1 but cannot flow smoothly in the directions b and c and takes longer time to heat the wafer to the saturation temperature. That is, although there is smaller temperature difference in portion of the wafer located over the straight part of the gas flow passage 4 running from the through-hole 5 in the direction a toward the periphery, temperature difference in portion of the wafer located over the directions b and c becomes larger. The time taken to reach the saturation temperature is also longer in the directions b and c than the direction a. This is supposedly because the smaller R shape of the arced corner causes the gas supplied through the through-hole to flow predominantly in the direction a, thus reaching the saturation temperature first in the direction a. When the size of the R shape is larger than 2 mm, on the other hand, the gas flows smoothly in the directions b and c although it may take a longer time to reach saturation temperature along the periphery. That is, the predetermined temperature is reached first in the area around the through-hole 5, and it takes a longer time to reach the predetermined temperature along the periphery. This is supposedly because the larger R shape of the arced corner causes the gas to flow predominantly in directions b and c in FIG. 1, thus reaching the saturation temperature first in the area around the through-hole 5 where the gas is supplied. Thus it can be seen that size of the R shape is preferably from 0.1 to 2 mm.

Size of R shape of the curved surface connecting the bottom surface of the gas flow passage 8d and the protrusion 8b is preferably from 0.01 to 0.1 mm. By controlling the size of the R shape in a range from 0.01 to 0.1 mm, it is made possible to shorten the time taken to reach the predetermined temperature of the wafer and improve the uniformity of heating. When the size of the curved surface is less than 0.01 mm, the gas becomes stagnant in the curved surface connecting the bottom surface of the gas flow passage 8d and the protrusion 8b and cannot flow smoothly, thus resulting in larger temperature difference across the surface of the wafer W. When the size of the R shape is larger than 0.1 mm, depth of the groove must be larger than 0.1 mm which leads to smaller distance between the electrode and the bottom of the groove, thus giving rise to the possibility of insulation breakdown between the bottom of the groove 4 and the electrode when the voltage is applied between the wafer W and the electrode. Thus it can be seen that size of R shape of the curved surface connecting the bottom surface of the gas flow passage 8d and the protrusion 8b is preferably from 0.01 to 0.1 mm.

Size of R shape of the curved surface can be given as the radius measured in a plane perpendicular to the side of the protrusion 8b and the top surface of the protrusion 8b.

Arithmetic mean surface roughness of the bottom surface of the gas flow passage 8d is preferably 2 μm or less, and more preferably 1 μm or less. By controlling the arithmetic mean surface roughness to 2 μm or less, the bottom surface of the gas flow passage 8d becomes smooth enough to allow the gas of a low pressure to flow smoothly in the groove. When the arithmetic mean surface roughness exceeds 2 μm, impact resistance of the bottom surface of the groove to the gas increases and may make it impossible for the gas to flow smoothly in the gas flow passage 8d. As a result, it may take a longer time to heat the wafer W to the saturation temperature in equilibrium, and temperature difference across the wafer surface may increase.

It is preferable that total area of the top surfaces of the protrusions 8b and of the ring-shaped wall 8c provided along the periphery is from 50 to 80% of the area of the wafer mounting surface 8a, and the height of the protrusion 8b from the bottom surface of the gas flow passage 8d is from 10 to 100 μm. Since the attracting force of the electrostatic chuck 1 based on Coulomb force is weak, it is necessary to provide as large a contact area with the wafer W as possible so as to increase the attracting force. It is preferable that the contact area is 50% or more, since it eliminates the possibility of the wafer W being lifted off the electrostatic chuck 1 when the gas is supplied to the gas flow passage 8d. When the total area of the top surfaces of the protrusions 8b and of the ring-shaped wall 8c provided along the periphery is more than 80% of the area of the wafer mounting surface 8a, area of the gas flow passage 8d becomes too small and the temperature difference across the surface of the wafer W may become large. Thus it can be seen that total area of the top surfaces of the protrusions and of the ring-shaped wall provided along the periphery is preferably from 50 to 80% of the area of the wafer mounting surface.

Height of the protrusion 8b from the bottom surface of the gas flow passage 8d is preferably from 10 to 100 μm. Although Japanese Unexamined Patent Publication No. 9-172055 describes that the height is preferably from 5 to 10 μm, this level of height makes the proportion of contact area between the electrostatic chuck and the wafer as small as 5 to 10% which allows the gas to spread smoothly to the entire area even when the groove depth is small, although the electrostatic chuck of the present invention has contact area with the wafer as large as 50 to 80%, and the groove must have depth of at least 10 μm so that the gas can spread smoothly to the entire area.

Height of the protrusion 8b from the bottom surface of the gas flow passage 8d is preferably not larger than 100 μm. In order to achieve a large attracting force, it is better to keep the distance between the electrode of the electrostatic chuck that generates the Coulomb force and the mounting surface small, in a range from 200 to 400 μm. When depth of the groove 4 is larger than 100 μm, distance between the bottom of the groove and the electrode becomes smaller than 100 to 300 μm, thus giving rise to the possibility of insulation breakdown between the bottom of the groove 4 and the electrode when the voltage is applied between the wafer and the electrode. Thus it can be seen that distance of the tip of the protrusion 8b from the gas flow passage is preferably in a range from 10 to 100 μm. Distance of the top surface of the protrusion 8b from the bottom surface of the gas flow passage 8d can be determined as the mean value of heights of the protrusions 8b from the bottom surface of the gas flow passage 8d, excluding the R shape, measured at 5 points.

The protrusions 8b, the ring-shaped wall 8c and the gas flow passage 8d can be formed by sand blast process, processing with a machine tool, ultrasound machining or the like. When the accuracy of machining, freedom of shape forming and the cost of processing are taken into consideration, sand blast process is preferably employed.

The protrusion 8b is preferably smaller, since smaller contact area with the wafer W means larger effect of transferring the heat through the gas, thus minimizes the temperature difference across the surface of the wafer W. However, contact area with the wafer W in a range from 50 to 80% is required as described above, and there is a proper range for the size of the protrusion 8b. When width of the groove is less than 0.5 mm, the passage where the gas flows becomes too small and temperature difference across the surface of the wafer W may become large. Thus the minimum size of the protrusion that keeps the contact area not less than 50% is about 1.5 mm across the opposing sides of the protrusion. It is not preferable that the distance across the opposing sides of the protrusion is larger than 10 mm, since it leads to lower temperature of the wafer at the positions that correspond to the centers of the protrusions. The distance across the opposing sides of the protrusion is more preferably in a range from 2 to 8 mm, furthermore preferably in a range from 3 to 7 mm.

Figure 2A:
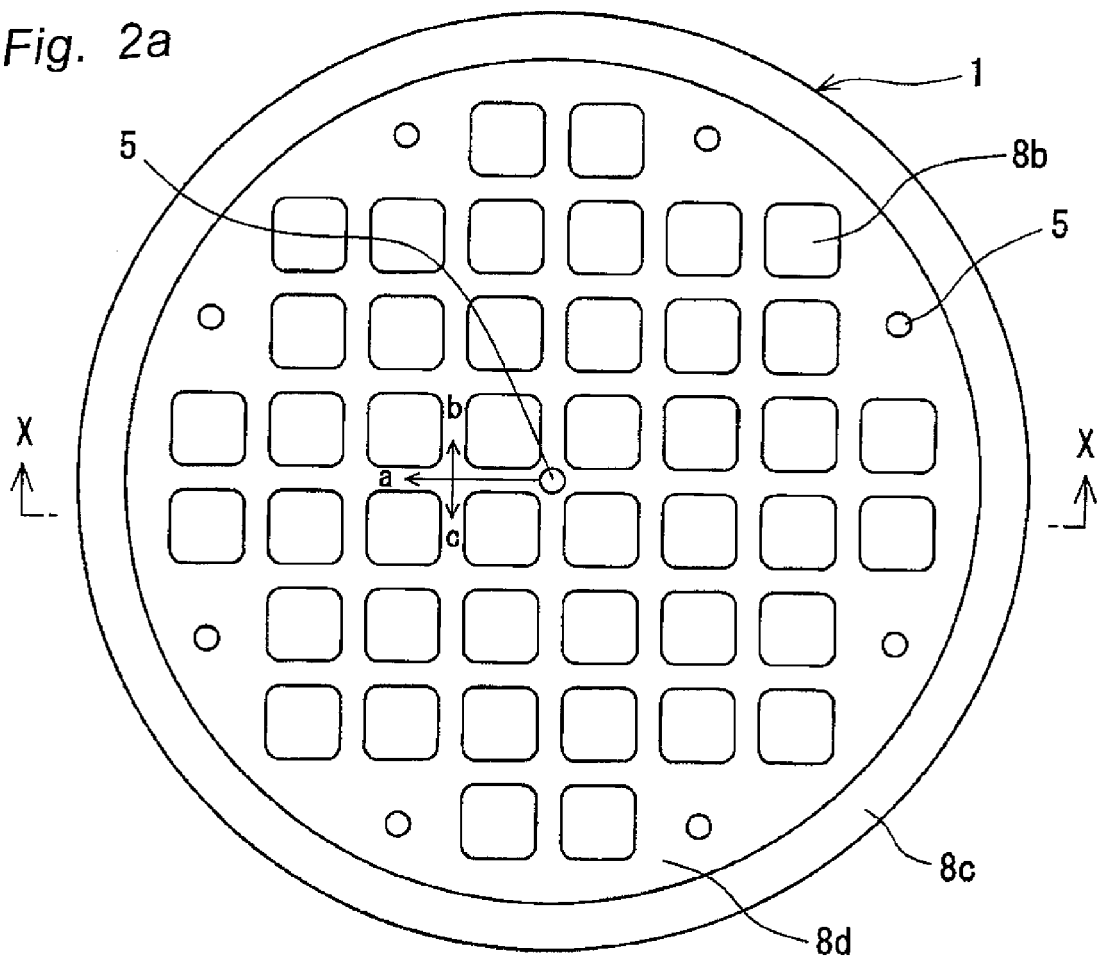
FIG. 2a is a schematic plan view showing the electrostatic chuck of the present invention.
Figure 2B:
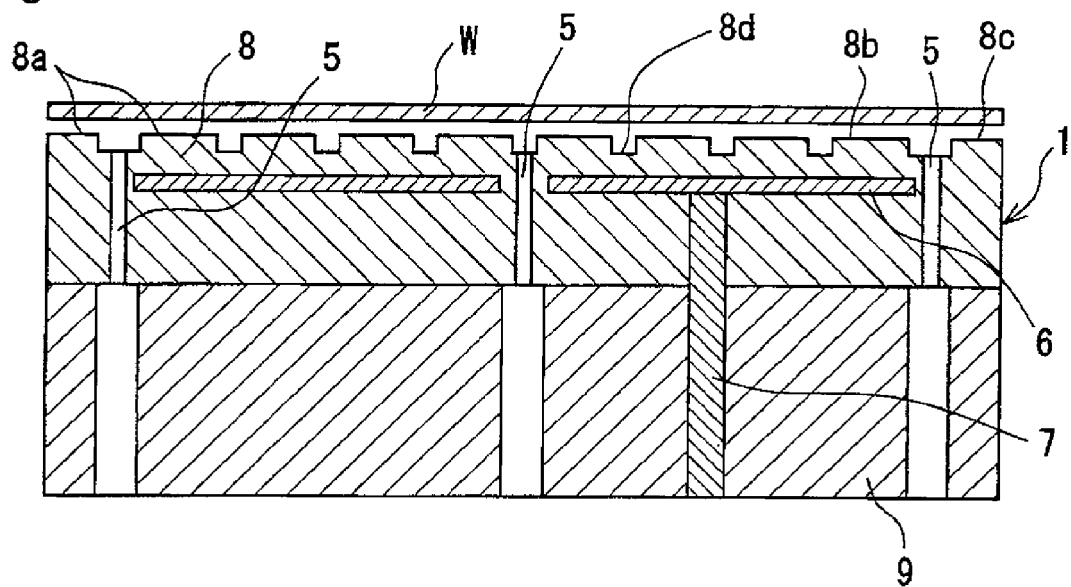

As shown in FIG. 2, it is also preferable to provide the through-holes 5, one at the center of the mounting surface and a plurality of through-holes 5 along a concentric circle. The gas introduced from the through-hole 5 provided at the center can be caused to flow evenly from the center toward the periphery. By introducing the gas also from the plurality of through-holes 5 provided along the concentric circle, it is made possible to supply the gas throughout the mounting surface 8a in a shorter period of time and decrease the time taken to heat the surface of the wafer W to the saturation temperature.

Figure 4:
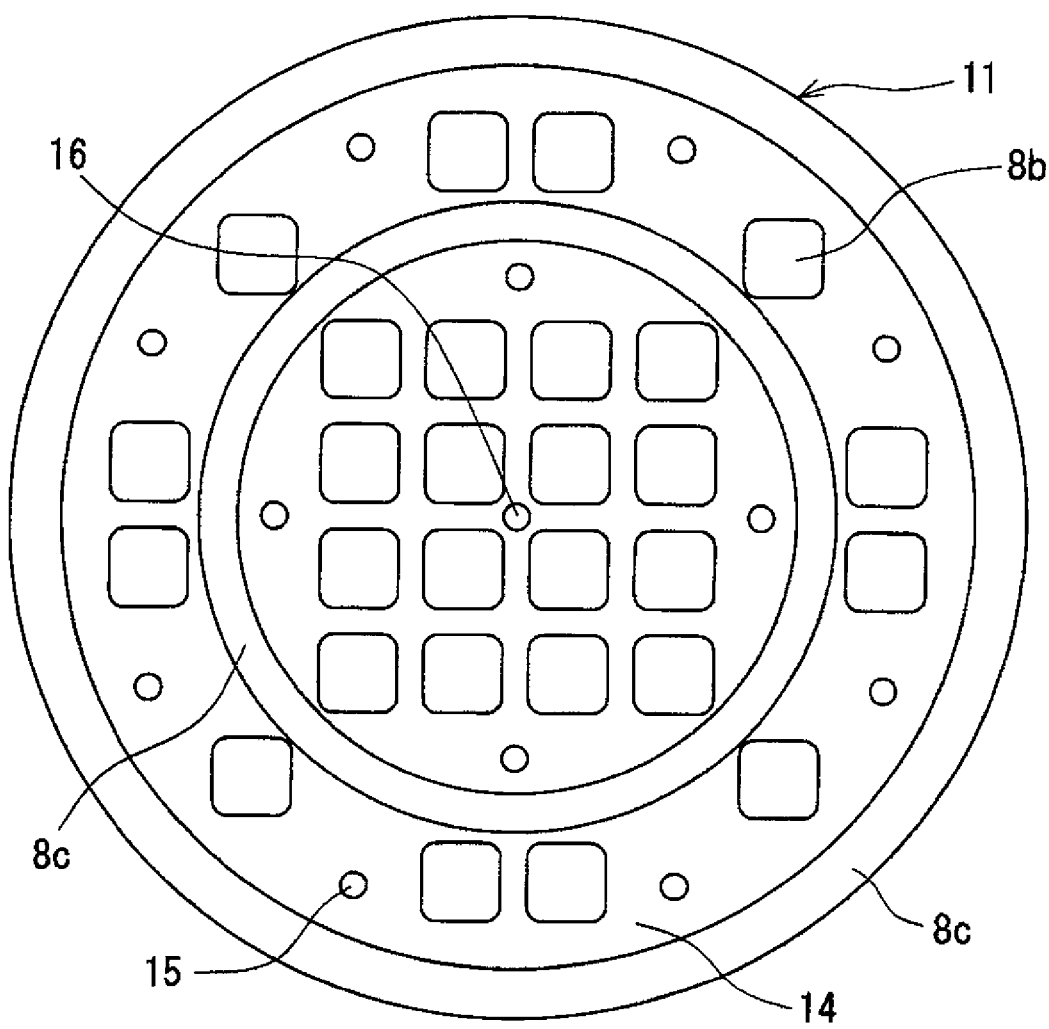
FIG. 4 is a schematic view showing an electrostatic chuck of the present invention.
Figure 5:
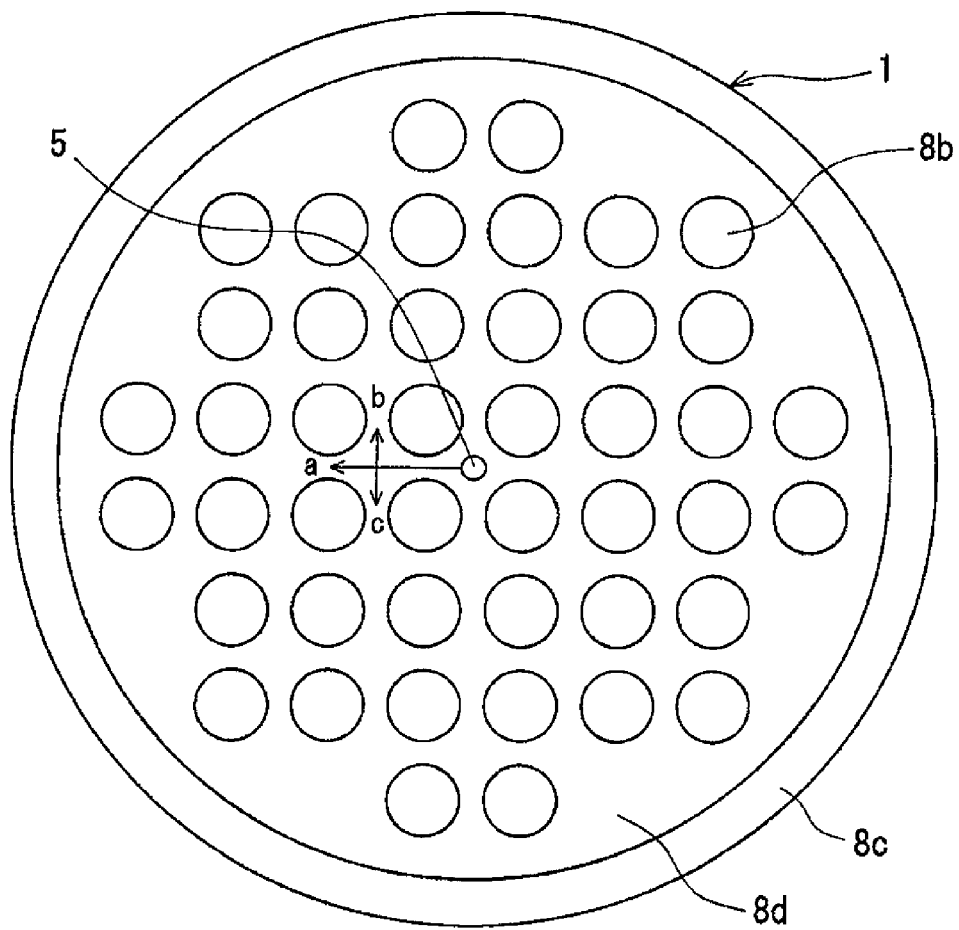
FIG. 5 is a schematic view showing an electrostatic chuck of the prior art.

As shown in FIG. 4, it is preferable to provide the ring-shaped walls 8c along the periphery of the mounting surface and at a position located inside the periphery of the mounting surface, provide a plurality of through-holes 15 between the outer ring-shaped wall 8c and the inner ring-shaped wall 8c, and provide through-holes 16 at a position inside the inner ring-shaped wall 8c, since this constitution makes it possible to minimize the temperature difference across the surface of a large wafer W measuring 300 mm or larger in diameter. The reason is that, by supplying the gas through the through-holes 15 provided between the outer ring-shaped wall 8c and the inner ring-shaped wall 8c and the through-holes 16 provided at the position inside the inner ring-shaped wall 8c separately while adjusting the flow rates in the individual lines, it is made possible to control the heat transfer between the mounting surface 8a and the wafer W in the inner area of the mounting surface and in the area along the periphery, thereby minimizing the temperature difference across the surface of the wafer W, and improve the uniformity of heating.

It is also preferable that diameter of the plate-like member 8 is from 180 to 500 mm, more preferably from 180 to 350 mm, and the number of the through-holes 5, 15, 16 is from 4 to 100 each measuring in a range from 0.1 to 5 mm in diameter. By providing the through-holes 5, 15, 16 in number ranging from 4 to 100 each measuring 0.1 to 5 mm in diameter, it is made possible to distribute the gas uniformly in the gas flow passage 8d, thereby to decrease the time taken to heat the wafer to the saturation temperature, minimize the temperature difference across the surface of the wafer W and improve the uniformity of heating. When the through-holes 5, 15, 16 are smaller than 0.1 mm in diameter, sufficient amount of the gas may not be supplied due to the small through-holes, resulting in a longer time taken to heat the wafer W to the saturation temperature. When the through-holes 5, 15, 16 are larger than 5 mm in diameter, on the other hand, the gas may concentrate in the areas near the through-holes and raise the temperature in these areas, while temperatures of the other portions of the mounting surface may remain low resulting in non-uniform heating of the wafer W. When the number of the through-holes 5, 15, 16 is 0, the gas cannot be supplied into the gas flow passage and results in non-uniform heating of the wafer. When this number exceeds 100, the gas flowing out of one through-hole clashes with the gas flowing out of other through-holes and the resultant disturbance in the flow results in non-uniform heating of the wafer W. Thus it is preferable that 4 to 100 of the through-holes measuring 0.1 to 5 mm in diameter are provided.

It is also preferable to provide a heat exchanger 9 on the other main surface of the plate-like member 8. While the plasma heats the wafer W and a large amount of heat is transferred to the mounting surface 8a, the heat exchanger 9 provided on the other main surface of the plate-like member 8 makes it possible to transfer the heat of the mounting surface 2a from the plate-like member 8 efficiently to the heat exchanger 9, so as to suppress the temperature of the mounting surface 2a from rising and suppress the temperature of the wafer W from rising. The heat exchanger 9 is preferably made of a metal having high heat transmission coefficient, particularly aluminum. The heat exchanger 9 and the plate-like member 8 are bonded preferably by means of indium bonding or silicon adhesive. It is also preferable that the heat exchanger 9 has a flow passage 9a for water or a gas which removes heat to the outside to flow therein. Flowing cooling water or gas through the flow passage 9a makes heat exchange easier and enables it to cool the mounting surface 2a more efficiently.

The plate-like member 8 that constitutes the electrostatic chuck 1 may be made of a sintered material consisting of alumina, aluminum nitride or silicon nitride as the main component, while a sintered material consisting of alumina or aluminum nitride as the main component which has high resistance to plasma is preferably used.

The material used to form the attracting electrode 6 embedded in the plate-like member 8 is preferably such that has thermal expansion similar to that of the sintered material constituting the plate-like member 8, such as molybdenum, tungsten, tungsten carbide or the like.

The embodiment described above takes the electrostatic chuck 1 having the structure shown in FIG. 1 as an example, although the electrostatic chuck 1 of the present invention is not limited to the structure shown in FIG. 1. For example, such a constitution may be employed as a heater electrode is embedded in the dielectric material 2, in which case the electrostatic chuck 1 can be heated directly by the heating electrode with less heat loss than in the case of indirect heating method.

In addition to the electrostatic attraction electrode 4, a plasma generating electrode may also be provided, which makes it possible to simplify the constitution of the film forming apparatus and the etching apparatus. Such modifications can be made within the scope of the present invention.

The electrostatic chuck 1 of the present invention comprises the plate-like ceramic member 2 made of aluminum nitride of which one main surface serves as the wafer mounting surface 2a and the electrode 3 is provided either on the other main surface or inside of the plate-like ceramic member 2, wherein mean distance t of the dielectric layer 2b between the electrode 3 and the mounting surface 2a is 0.015 cm or more, the product of specific volume resistivity R of the dielectric layer 2b provided between the electrode 3 and the mounting surface 2a and the mean distance t (t×R) is in a range from $1 \times 10^7$ to $5 \times 10^{16}$ $\Omega \cdot cm^2$, the mean particle size of aluminum nitride used in forming the dielectric layer 2b is in a range from 1 to 20 µm, and open porosity in the dielectric layer 2b is 1% or less.

The mean distance t of the dielectric layer 2b between the electrode 3 and the mounting surface 2a is the mean distance t between the mounting surface 2a and the electrode 3, if the mounting surface 2a is a uniform plane, or the mean value t of the distance between the bottom surface 8d of the gas flow passage of the mounting surface 8a and the electrostatic attraction electrode 6 in case the gas flow passage is formed in the mounting surface 8a. Specifically, the distance between the bottom surface 8d of the gas flow passage of the mounting surface 8a and the electrostatic attraction electrode 6 may be measured at 10 points and averaged to give the mean distance t. When the distance between the bottom surface 8d of the gas flow passage of the mounting surface 8a and the electrostatic attraction electrode 6 cannot be measured directly by means of ultrasonic measurement or the like, the distance between the bottom surface 8d and the electrostatic attraction electrode 6 can be determined by measuring the distance between the protrusion 8b and the electrostatic attraction electrode 6 and subtracting the maximum depth of the bottom surface 8d of the gas flow passage near the measuring point therefrom. For example, the mean distance between the electrode and the mounting surface can be measured by the ultrasonic measurement method. With the ultrasonic measurement method, actual distance can be determined from the correlation between the distance between electrode and the mounting surface obtained from a known sample and the distance measured from the reflection of ultrasound. The mean distance t can be determined by averaging the values measured at 10 points. Specifically, distance between the electrode 3 of the electrostatic chuck constituted from the same dielectric layer 2b and the mounting surface 2a is measured by the ultrasonic measurement method (C-SAM D-9000 from SONOSCAN Inc.). Then the sample is cut at the measuring point in a direction perpendicular to the mounting surface, and the actual distance between the electrode and the mounting surface is measured. The difference between the value measured by the ultrasonic method and the actual distance measured along the cut surface is entered in the ultrasonic measuring instrument for correction, so that the mean distance t of less measurement error can be obtained.

The constitution of the electrostatic chuck 1 which comprises the plate-like ceramic member 2 made of aluminum nitride of which one main surface serves as the wafer mounting surface 2a and the electrode 3 is provided either on the other main surface or inside of the plate-like ceramic member 2, wherein mean distance of the dielectric layer 2b between the electrode 3 and the mounting surface 2a is 0.015 cm or more is selected because the larger the thickness of the dielectric layer 2b and the higher the specific volume resistivity of the dielectric layer 2b, the higher the durability becomes to voltage impression and open cycles, although the dielectric layer 2 having thickness less than 0.015 cm does not have the durability to voltage impression and open cycles which is the object of the present invention. Therefore, it is important that the mean thickness of the dielectric layer 2 is 0.015 cm or more.

It is preferable that the product t×R of mean distance t between the electrode 3 and the mounting surface 2a and specific volume resistivity R of the dielectric layer 2b provided between the electrode 3 and the wafer mounting surface 1 is in a range from $1 \times 10^7$ to $5 \times 10^{15}$ $\Omega \cdot cm^2$, because the larger the thickness t of the dielectric layer 2b and the higher the specific volume resistivity of the dielectric layer 2b, the higher the durability becomes to the repetitive voltage impression and open cycles, and the product t×R can be regarded as an index that represents the durability to the repetitive voltage impression and open cycles.

When the product t×R is less than $1 \times 10^7$ $\Omega cm^2$, sufficient durability to the repetitive voltage impression and open cycles which is the object of the present invention cannot be obtained because thickness of the dielectric layer 2b is too small, specific volume resistivity of the dielectric layer 2b is too low, or due to both of these causes.

When the product t×R is larger than $5 \times 10^{15}$ $\Omega \cdot cm^2$, it becomes difficult remove the voltage so as to release the wafer W and send the wafer to the next process after holding the wafer W with the electrostatic chuck, that is a wafer holding member used to hold a semiconductor wafer in a film forming apparatus such as CVD, PVD, sputtering, SOD, SOG, etc. and in an etching apparatus in the semiconductor manufacturing process, particularly holding the wafer by means of Johnson Rahbeck effect or Coulomb force in vacuum environment in the film forming apparatus or the etching apparatus. In order to release the wafer W which is attracted, dielectric polarization that has been achieved by applying the voltage to the electrode 3 must be brought into equilibrium. However, when the product t×R is larger than $5 \times 10^{15}$ $\Omega \cdot cm^2$, it takes too longer time to release the wafer W since it takes longer time to bring dielectric polarization that has been achieved by applying the voltage to the electrode 3 must be brought into equilibrium because the thickness of the dielectric layer 2b is too large or specific volume resistivity R of the dielectric layer 2b is too high. As a result, performance of the electrostatic chuck becomes unfavorable at all, though sufficient durability to the repetitive voltage impression and open cycles which is the object of the present invention can be achieved.

Therefore, it is important that the product t×R of mean distance t between the electrode 3 and the mounting surface 2a and the specific volume resistivity of the dielectric layer 2b provided between the electrode 3 and the mounting surface 2a is in a range from $1\times10^7$ to $5\times10^{15}$ $\Omega\cdot cm^2$.

The mean particle size of aluminum nitride used in forming the dielectric layer 2b is set in a range from 1 to 20 μm, because it was found that the mean particle size of aluminum nitride has great influence on the durability to the repetitive voltage impression and open cycles which is the object of the present invention.

Mean particle size of aluminum nitride that is either smaller than 1 μm or larger than 20 μm is not preferable since it has an unfavorable effect on durability to the repetitive voltage impression and open cycles which is the object of the present invention. When the mean particle size of aluminum nitride is smaller than 1 μm, durability to the repetitive voltage impression and open cycles becomes lower because the aluminum nitride consisting of too fine particles has low durability to voltage. As a result, during cycles of applying a voltage of 1 kV (monopole) for 1 minute and opening the voltage, although insulation breakdown does not occur in the early stage, the aluminum nitride particles break one by one as the impression of voltage is repeated, and insulation breakdown may occur before experiencing 10,000 cycles.

When the mean grain size of aluminum nitride is larger than 20 μm, durability to the repetitive voltage impression and open cycles becomes lower because the aluminum nitride consisting of too large particles causes lattice defects, which are potential causes of insulation breakdown, to be generated in a large number in the grain boundaries. When there are many lattice defects, the aluminum nitride particles break one by one as the impression of voltage is repeated during cycles of applying a voltage of 1 kV (monopole) for 1 minute and opening the voltage, although insulation breakdown does not occur in the early stage, insulation breakdown may occur before experiencing 10,000 cycles as the lattice defects subjected to insulation breakdown are connected with each other.

Therefore, it is important that the mean crystal grain size of aluminum nitride used in forming the dielectric layer 2 is set in a range from 1 to 20 μm.

In order to determine the mean crystal grain size of aluminum nitride, the dielectric layer used to form the mounting surface 2a was polished to mirror finish and was then etched. The etched surface was photographed under SEM (scanning electron microscope) with magnifying power of 2000. 3 lines each 7 cm long were drawn on the photograph, and the mean crystal grain size was determined by dividing the total length of the line segments by the number of aluminum nitride crystal grains that crossed the lines.

Open porosity of the dielectric layer 2b is set to 1% or lower, because it was found that what exerts influence on durability to the repetitive voltage impression and open cycles is the open porosity of the dielectric layer 2b, in the research conducted by the present inventor.

While Japanese Unexamined Patent Publication No. 9-172055 describes that porosity is 3% or less, sintered aluminum nitride made by hot press process has a high open porosity of 1.3% near the surface and it has not been possible to suppress the open porosity within 1% since the dielectric layer of the electrostatic chuck is located near the surface of the sintered material. Thus the invention of Japanese Unexamined Patent Publication No. 9-172055 does not have durability to voltage impression and open cycles. With this respect, it is apparent that the present invention is quite distinguished from that of Japanese Unexamined Patent Publication No 9-172055.

What exerts influence on durability to the repetitive voltage impression and open cycles is the open porosity of the dielectric layer 2b, because the existence of the open pores in the dielectric layer 2b allows electric discharge to occur since the gap between the attracted surface of the wafer W and the bottom surface of the porous section, while insulation breakdown proceeds gradually in the open pores, eventually resulting in insulation breakdown of the dielectric layer 2b. As a result, although the electrostatic chuck can be used without problem in the early stage, insulation breakdown of the dielectric layer 2 gradually occurs as the operation is repeated, eventually resulting in insulation breakdown. Therefore, it is important that open porosity in the dielectric layer 2 is 1% or lower.

The present invention provides the electrostatic chuck 1 comprising the plate-like ceramic member made of sintered aluminum nitride of which one main surface serves as the wafer mounting surface 1 and the electrode 3 is provided either on the other main surface or inside of the plate-like ceramic member, wherein mean distance of the dielectric layer 2 between the electrode and the mounting surface is 0.015 cm or more, the product of mean distance between the electrode and the wafer mounting surface and specific volume resistivity of the dielectric layer 2 that constitutes the portion between the electrode and the wafer mounting surface is in a range from $1\times10^7$ to $5\times10^{15}$ $\Omega\cdot cm^2$, the mean particle size of aluminum nitride used in forming the dielectric layer 2b is set in a range from 1 to 20 μm, and the open porosity of the dielectric layer 2b is 1% or lower, so that insulation breakdown of the dielectric layer 2b does not occur even when voltage impression and open cycles is repeated 1,000 cycles, each applying voltage of 1 kV for 1 minute and opening Observation of a section of the dielectric layer under SEM with magnifying power of 10,000 to 60,000 shows the existence of in-grain pores located in crystal grains and grain boundary pores located in the crystal grain boundaries. Maximum size of the crystal boundary pores is determined in an area of 5 cm square on the photograph taken under SEM with magnifying power of 10,000 to 60,000, and the maximum sizes obtained from 10 photographs are averaged to give the mean size of the crystal boundary pores. It is important that the mean size of the crystal boundary pores is smaller than the mean crystal grain size of aluminum nitride, in order to keep the open porosity within 0.8%. When the mean size of the crystal boundary pores is equal to or larger than the mean crystal grain size of aluminum nitride, aluminum nitride particles that constitute the sintered aluminum nitride are likely to come off and, as a result, pores are generated as the particles come off in the subsequent machining process however dense the material is sintered. The present inventors have found that it is important that the mean size of the crystal boundary open pores is smaller than the mean crystal grain size of aluminum nitride.

Observation of a section of the dielectric layer under SEM with magnifying power of 10,000 to 60,000 shows the existence of in-grain pores. Maximum size of the in-grain pores is determined in an area of 5 cm square on 10 photographs taken under SEM with magnifying power of 10,000 to 60,000, and the area of a circle having diameter equal to the maximum size is divided by the actual area of the region 250 cm², so as to calculate the proportion Sc of the in-grain pores. Proportion Sg of the crystal boundary pores is similarly determined, thereby to calculate the ratio Sg/Sc. It is important that the ratio Sg/Sc is not higher than 1.0, in order to keep the open porosity within 0.6%. When the ratio Sg/Sc exceeds 1.0 so that proportion of the crystal boundary pores increases, open porosity increases as the particles come off in the machining process. The inventors of the present invention have found that it is important that the ratio Sg/Sc is not higher than 1.0, in order to keep the open porosity within 0.6%.

It is preferable that the dielectric layer is constituted from aluminum nitride as the main component and 0.2 to 15% by weight of oxide of group 3a metal as the auxiliary component, since this makes it possible to control the specific volume resistivity to a desired value.

The group 3a metal that forms the oxide described above is preferably cerium, since cerium has the highest durability to the repetitive voltage impression and open cycles among the group 3a metal elements. This is because cerium oxide forms a compound represented by $CeAlO_3$ in the grain boundaries of the sintered aluminum nitride, $CeAlO_3$ is formed through reaction of very thin $Al_2O_3$ layer which covers the surface of aluminum nitride particles and $Ce_2O_3$ which is an oxide of three valence Ce, so that grain boundary defects can be substantially eliminated between the aluminum nitride particles and the grain boundary phase.

The electrostatic chuck 1 of the present invention is characterized in that the plate-like ceramic member 2 made of aluminum nitride is formed by sintering at a temperature from 1800 to 1900° C. in non-oxidizing atmosphere of 0.2 to 200 MPa for a period of 0.5 to 20 hours, in order to control the mean grain size and the open porosity of the dielectric layer 2b. The plate-like ceramic member 2 of aluminum nitride can be formed by hot press method, pressured atmosphere sintering method, HIP method or the like. With the hot press method, the material is sintered by coating the carbon mold with boron nitride, since the material makes direct contact with the carbon mold. In this case, open pores are likely to be generated through reaction of boron nitride and sintered aluminum nitride. In order to decrease the open porosity in the plate-like ceramic member 2 made of aluminum nitride that is obtained by hot press method, it is necessary to remove at least 0.5 mm of the material from the hot pressed surface by grinding, which is not suited to mass production and is not desirable. With the pressured atmosphere sintering method or HIP method, open porosity can be kept within 0.5% by sintering in a non-oxidizing atmosphere under a pressure of 0.2 to 200 MPa. By sintering at a temperature from 1800 to 1900° C. for a period of 0.5 to 20 hours, the mean particle size of aluminum nitride can be set in a range from 5 to 15 µm, so that the electrostatic chuck 1 can be obtained that does not undergo insulation breakdown of the dielectric layer 2b even when voltage impression and open cycles are repeated 1,000 cycles or more, each applying voltage of 1 kV for 1 minute and opening.

Another method of manufacturing the electrostatic chuck 1 of the present invention will now be described.

The plate-like ceramic member 2 which constitutes the electrostatic chuck can be made of sintered aluminum nitride. To make the sintered aluminum nitride, about 10% by weight or less oxide of group 3a element is added to an aluminum nitride powder and mixed in a ball mill using IPA and urethane balls for 48 hours. The aluminum nitride slurry thus obtained is passed through a sieve of #200 mesh, so as to remove dust of balls and the inner wall of the ball mill. Then the slurry is dried in an explosion-free dryer at 120° C. for 24 hours, so as to obtain a homogeneous aluminum nitride powder. The powder is mixed with a binder based on acrylic resin and a solvent thereby to prepare a slip based on aluminum nitride, which is formed into a tape by doctor blade method. A plurality of pieces obtained from the aluminum nitride tape are stacked and the electrostatic attraction electrode 3 is formed on the stack from tungsten by screen printing. A desired adhesive liquid is applied to a blank tape, and a stack of a plurality of tapes is pressed into a green compact.

The green compact thus obtained is heated at 500° C. for about 5 hours in a stream of non-oxidizing gas, so as to debinder. The green compact is sintered at a temperature from 1800 to 1900° C. in non-oxidizing atmosphere under a pressure ranging from 0.2 to 200 MPa for a period of 0.5 to 20 hours so as to be sintered. Thus the sintered aluminum nitride having the electrode 3 embedded therein is obtained.

Figure 6:
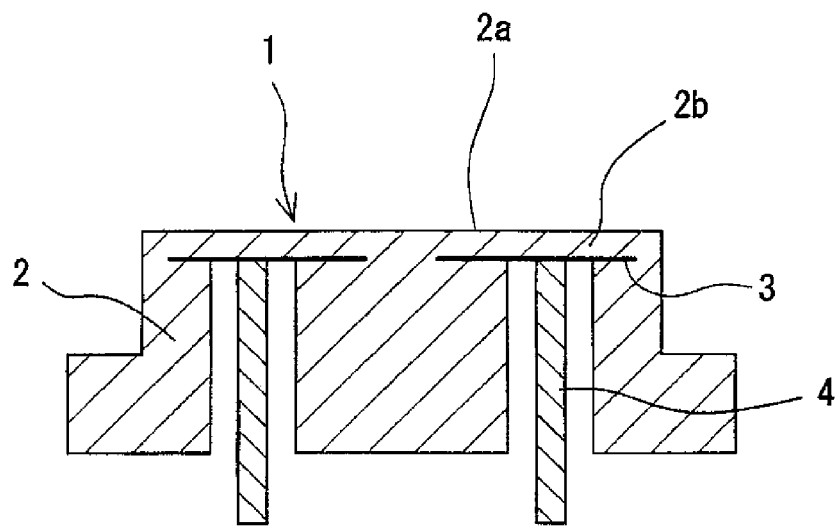
FIG. 6 is a sectional view showing a wafer holding member of the present invention.
Figure 7:
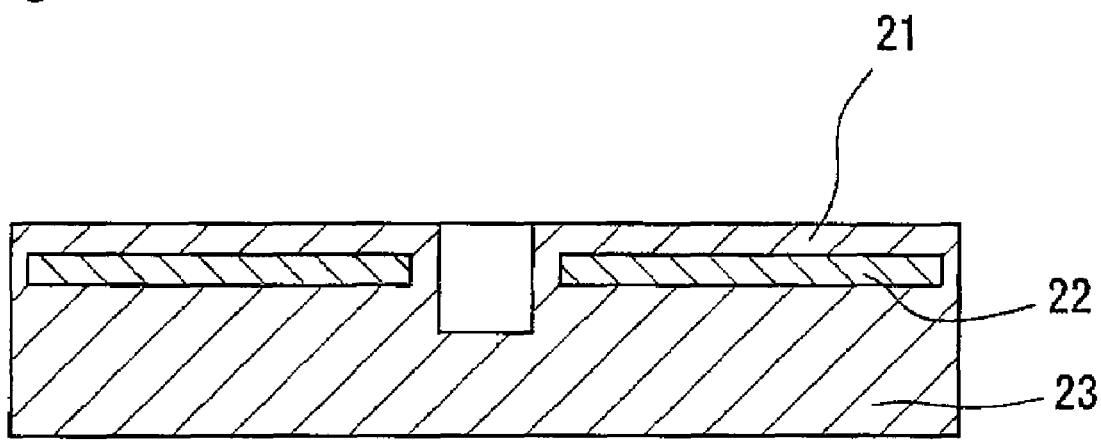
FIG. 7 is a sectional view showing a wafer holding member of the prior art.

The sintered aluminum nitride thus obtained is machined into a desired shape. A metal terminal 4 for applying a voltage to the electrode 3 is bonded by metallizing process or the like, thereby to obtain the electrostatic chuck 1 of the present invention shown in FIG. 6.

EXAMPLE 1

Specific examples of the present invention will now be described by taking the electrostatic chuck as an example.

First, an example of the plate-like member made of alumina $Al_2O_3$ will be described. 0.2% by weight of CaO and $SiO_2$ was added as a sintering additive to an $Al_2O_3$ powder having a mean particle size of 1.0 µm and purity of 99.9% by weight, and a slurry was made by adding a binder and a solvent. The slurry was processed by doctor blade method to form a plurality of green sheets of alumina.

A metal paste of molybdenum was applied onto one of the green sheets of alumina in the predetermined pattern of the electrodes by screen printing method, so as to form the electrostatic attraction electrode. The remaining green sheets of alumina were stacked on the surface opposite to the side where the metal paste was applied. On the other hand, a plurality of green sheets of alumina without the metal slurry printed thereon were stacked, and a hole 5 mm in diameter for feeding power was made at a predetermined position of the stack. The power feeding hole is for the purpose of connecting the power terminal to the electrode.

The stacks were put together by thermal bonding at a temperature of 50° C. under a pressure of $1.5 \times 10^7$ Pa. The stacks having the printed surface and the power feeding hole formed therein were put one on another so as to cover the surface where the electrodes were printed, and were put together by thermal bonding at a temperature of 50° C. under a pressure of $1.7 \times 10^7$ Pa. The ceramic stack thus prepared was machined into a disk shape.

The ceramic stack was debindered by heating in a mixed atmosphere furnace of nitrogen and hydrogen, and was sintered at a temperature of 1600° C. under a normal pressure for about 3 hours using a mixed atmosphere furnace of nitrogen and hydrogen. The plate-like member having the electrostatic attraction electrode embedded therein was thus obtained.

A through-hole measuring 1 mm in diameter was made at the center of the plate-like member. The plate-like member was polished till the thickness reached 3 mm, so as to form the mounting surface having maximum height (Rmax) of 1 µm or less on one of the main surfaces (largest surface), and the power feeding terminal was connected in electrical continuity with the electrostatic attraction electrode.

Then sand blast was applied so as to form the protrusions, the ring-shaped wall and the groove and make the electrostatic chuck measuring 200 mm in diameter and 3 mm in thickness. A heat exchanger made of aluminum was bonded onto the plate-like member by means of a silicon adhesive.

The electrostatic chucks having the protrusions formed in substantially square shape measuring 6 mm across opposing sides with R shape connecting the sides formed in sizes of 0.05 mm, 0.1 mm, 0.5 mm, 2 mm and 2.5 mm, and the electrostatic chucks having non R shape were made. Intervals between the protrusions were set to 1 mm in all electrostatic chucks. The through-hole measuring 3 mm in diameter for supplying gas was formed at the center of the mounting surface.

Distance from the groove to the top surface of the protrusion was set to 50 μm and surface roughness Ra of the groove was set to 0.5 μm.

The 6 kinds of electrostatic chuck made as described above were placed in a vacuum chamber, a temperature measuring silicon wafer provided with thermocouples at 17 positions thereon was placed on the mounting surface of the electrostatic chuck, and the pressure in the vacuum chamber was reduced to $10^{-1}$ Pa. Then a voltage of 1000 V was applied between the electrostatic attraction electrode of the electrostatic chuck and the wafer W so as to generate Coulomb force thereby attracting the wafer W holding onto the mounting surface, and the wafer was heated to 100° C. by means of a halogen heater installed in the vacuum chamber. Then helium gas was introduced at a pressure of 1300 Pa through the through-hole, and the time taken to heat the wafer to the saturation temperature and the temperature distribution of the wafer at the saturation temperature were measured.

The saturation temperature refers to the mean temperature at a time when the rate of change of the wafer mean temperature becomes not higher than 0.1° C./sec. The time taken to reach the saturation temperature is the period of time from supplying helium gas to the time when the saturation temperature is reached.

Mean temperature of the wafer was determined by averaging the temperatures measured with the thermocouples attached to the wafer at 17 positions. Temperature distribution of the wafer at the saturation temperature was determined as the difference between maximum temperature and minimum temperature of the temperatures measured with the thermocouples attached to the wafer at 17 positions.

The results are shown in Table 1.

TABLE 1

| Sample No. | Size of corner R of protrusion (mm) | Temperature distribution of wafer (° C.) | Time taken to reach saturation temperature (seconds) |
|---|---|---|---|
| 1 | 0.05 | 1.2 | 3.2 |
| 2 | 0.1 | 1.0 | 3.0 |
| 3 | 0.5 | 0.8 | 2.5 |
| 4 | 2 | 0.9 | 2.6 |
| 5 | 2.5 | 1.1 | 3.2 |
| *6 | Non R | 3.0 | 5.0 |

Sample marked with * is out of the scope of the present invention.

Samples Nos. 1 through 5 of which protrusions have the shape of connecting the sides with R shape exhibit high performance with temperature distribution of wafer as small as 0.8 to 1.2° C. and short time taken to reach saturation temperature from 2.5 to 3.2 seconds.

Sample No. 6 of which protrusions does not have R shape exhibits poor performance with temperature distribution of the wafer as large as 3.0° C. and the time taken to reach the saturation temperature as long as 5.0 seconds. It was found that the unfavorable result was caused by the fact that there was a large temperature difference over the surface of the water W with the temperature being high around the groove running straight from the through-hole, and low around the direction perpendicular to the groove. The temperature around the groove running straight from the through-hole rose faster, while the temperature around the direction perpendicular to groove rose slowly, thus resulting in longer time taken to reach the saturation temperature.

Samples Nos. 2 through 4 of which protrusions have R shape of size from 0.1 to 2 mm exhibit even higher performance with temperature distribution of the wafer as small as 0.8 to 1.0° C. and short time taken to reach the saturation temperature of 3.0 seconds or less.

EXAMPLE 2

The electrostatic chucks were made similarly to Example 1. The grooves were formed by using a machining center with the R shape of the curved surface connecting the groove and the protrusion set to 0.005, 0.01, 0.05 and 0.1 mm, and the size of the R shape connecting the sides of the protrusion being set to 0.5 mm. The electrostatic chucks similar to No. 3 of Example 1 were made. Depth of the groove was set to 0.1 mm for the sample where the R shape of the curved surface connecting the groove and the protrusion was 0.1 mm. The electrostatic chucks were evaluated similarly to Example 1. The results are shown in Table 2.

TABLE 2

| Sample No. | Size of corner R shape (mm) | Temperature distribution of wafer (° C.) | Time taken to reach saturation temperature (seconds) |
|---|---|---|---|
| 7 | 0.005 | 0.8 | 2.4 |
| 8 | 0.01 | 0.7 | 2.2 |
| 9 | 0.05 | 0.6 | 2.2 |
| 10 | 0.1 | 0.5 | 2.1 |

Samples Nos. 8 through 10, of which R shape of the curved surface connecting the bottom surface of the groove and the protrusion was in a range from 0.01 to 0.1 mm, exhibit high performance with temperature distribution of the wafer as small as 0.5 to 0.7° C. and the time taken to reach the saturation temperature as short as 2.1 to 2.2 seconds.

Sample No. 7 shows a somewhat larger temperature distribution of the wafer, 0.8° C., and a longer time taken to reach the saturation temperature of 2.4 seconds. This is supposedly because the small R shape makes the gas likely to be stagnant at the position, resulting in unsmooth gas flow.

EXAMPLE 3

The electrostatic chucks were made similarly to Example 1. With the R shape of the corner of the protrusion 2 being set to 0.5 mm, abrasive size of the sand blast being changed and the arithmetic mean surface roughness Ra of the groove 4 being set to 0.3, 0.5, 1.0, 2.0 and 2.5, the electrostatic chucks otherwise similar to that of Example 1 were made. The electrostatic chucks were evaluated similarly to Example 1. The results are shown in Table 2.

TABLE 3

| Sample No. | Arithmetic mean surface roughness Ra of groove (μm) | Temperature distribution of wafer (° C.) | Time taken to reach saturation temperature (seconds) |
|---|---|---|---|
| 12 | 0.3 | 0.4 | 2.0 |
| 13 | 0.5 | 0.5 | 2.1 |
| 14 | 1.0 | 0.6 | 2.3 |
| 15 | 2.0 | 0.7 | 2.4 |
| 16 | 2.5 | 1.2 | 3.2 |

Samples Nos. 12 through 15, of which bottom surface of the groove has arithmetic mean surface roughness Ra of not larger than 2, exhibit even higher performance with temperature distribution of the wafer as small as 0.4 to 0.7° C. and the time taken to reach the saturation temperature as short as 2.0 to 2.4 seconds. The arithmetic mean surface roughness was measured according to JIS B0651.

Sample No. 16, of which bottom surface of the groove has arithmetic mean surface roughness Ra of 2.5, shows a somewhat larger temperature distribution of the wafer, 1.2° C., and a longer time taken to reach saturation temperature of 3.2 seconds. This is because the temperature rises first in the area around the through-hole where the gas is supplied, and the temperature distribution is larger in the peripheral portion. Larger surface roughness of the groove is considered to increase the resistance of the groove to the gas, thus resulting in unsmooth flow of gas.

EXAMPLE 4

The electrostatic chucks similar to sample No. 3 of Example 1 were made except for setting the size of the R shape of the arced corner connecting the sides of the protrusion to 0.5 mm, changing the distance between the opposing sides of the protrusion, setting the total area of the top surface of the protrusions and the ring-shaped wall within a range from 40 to 90% of the area of the wafer mounting surface, and setting the height of the protrusion from the bottom surface within a range from 5 to 100 μm.

The electrostatic chucks were evaluated similarly to Example 1. The results are shown in Table 4.

TABLE 4

| Sample No. | Proportion of total area of protrusions and ring-shaped wall to the area of wafer mounting surface | Distance of groove to top of protrusion | Temperature distribution of wafer (° C.) | Time taken to reach saturation temperature (seconds) |
|---|---|---|---|---|
| 22 | 50% | 50 | 0.4 | 2.0 |
| 23 | 60% | 50 | 0.5 | 2.1 |
| 24 | 80% | 50 | 0.7 | 2.4 |
| 25 | 90% | 50 | 1.0 | 3.0 |
| 26 | 50% | 5 | 0.7 | 3.2 |
| 27 | 50% | 10 | 0.7 | 2.3 |
| 28 | 50% | 100 | 0.4 | 2.0 |

Samples Nos. 22 through 24, 27 and 28, of which total area of the protrusions and the ring-shaped wall at the top thereof is in a range from 50 to 80% of the area of the mounting surface and height of the protrusion from the bottom surface is in a range from 10 to 100 μm, exhibit high performance with temperature distribution of the wafer as small as 0.4 to 0.7° C. and the time taken to reach the saturation temperature as short as 2.0 to 2.4 seconds.

Sample No. 25 shows a somewhat larger temperature distribution of the wafer, 1.0° C., and longer time taken to reach the saturation temperature of 3.0 seconds. This is supposedly because the gas flowing area is small and therefore sufficient gas cannot be supplied, thus resulting in larger temperature distribution and a longer time taken to reach the saturation temperature.

Sample No. 26 takes a somewhat longer time to reach the saturation temperature; 3.2 seconds. This is supposedly because the small depth of the groove caused a longer time to be taken in supplying the gas to the entire region.

EXAMPLE 5

The electrostatic chucks similar to sample No. 3 of Example 1 were made by forming 1, 10, 50, 100 or 200 through-holes for supplying the gas having diameter of 0.08, 0.1, 2, 5 or 6 mm at the center of the mounting surface and along a circle located at the same distance from the center.

Electrostatic chucks having one through-hole at the center of the mounting surface and electrostatic chucks without the through-hole were also made.

The electrostatic chucks were evaluated similarly to Example 1. The results are shown in Table 5.

TABLE 5

| Sample No. | Diameter of through-hole (mm) | Number of through-holes | Temperature distribution of wafer (° C.) | Time taken to reach saturation temperature (seconds) |
|---|---|---|---|---|
| 31 | 0.08 | 1 | 1.2 | 3.2 |
| 32 | 0.1 | 1 | 1.2 | 3.0 |
| 33 | 1 | 1 | 1.1 | 2.8 |
| 34 | 2 | 1 | 0.9 | 2.7 |
| 35 | 5 | 1 | 0.8 | 2.5 |
| 36 | 6 | 1 | 1.0 | 2.8 |
| *37 | 0.1 | 0 | 5.0 | 10 |
| 39 | 0.1 | 10 | 0.5 | 2.4 |
| 40 | 0.1 | 50 | 0.4 | 2.2 |
| 41 | 0.1 | 100 | 0.6 | 2.0 |
| 42 | 0.1 | 200 | 1.2 | 2.0 |
| 43 | 5 | 10 | 0.6 | 2.4 |
| 44 | 5 | 50 | 0.4 | 2.2 |
| 45 | 5 | 100 | 0.7 | 2.0 |
| 46 | 5 | 200 | 1.2 | 2.0 |

Sample marked with * is out of the scope of the present invention.

Samples Nos. 31 through 36 having one through-hole at the center of the mounting surface exhibit temperature distribution of 0.8 to 1.2° C. and somewhat longer time taken to reach the saturation temperature from 2.5 to 3.2 seconds.

Samples Nos. 39 through 46 having one through-hole at the center of the mounting surface and a plurality of through-holes around thereof exhibit favorable result with small temperature distribution of 0.4 to 1.2° C. and a short time taken to reach the saturation temperature from 2.0 to 3.2 seconds.

Samples Nos. 39 through 41 and 43 through 45 having 4 to 100 through-holes measuring from 0.1 to 5 mm in diameter exhibit favorable result with even smaller temperature distribution of 0.4 to 0.7° C. and short time taken to reach the saturation temperature from 2.0 to 2.4 seconds.

Sample No. 37 shows a time taken to reach the saturation temperature of 10 seconds and a large temperature distribution of 5° C. This is supposedly because the gas cannot be supplied to the groove, thus resulting in a larger temperature distribution of the wafer and a longer time taken to reach the saturation temperature.

EXAMPLE 6

10% by weight or less oxide of group 3a element was added to an aluminum nitride powder and mixed in a ball mill using IPA and urethane balls for 48 hours. The aluminum nitride slurry thus obtained was passed through a sieve of #200 mesh, so as to remove dust of balls and the inner wall of the ball mill. Then the slurry was dried in an explosion-free dryer at 120° C. for 24 hours, so as to obtain a homogeneous aluminum nitride powder. The powder was mixed with a binder based on acrylic resin and a solvent thereby to prepare a slip based on aluminum nitride, which was formed into a tape by doctor blade method.

A plurality of pieces obtained from the aluminum nitride tape were stacked and an electrode was formed on the stack from tungsten by screen printing. A desired adhesive liquid was applied to a blank tape, and a stack of a plurality of tapes was pressed into a green compact.

The mixture green compact of aluminum nitride and a tungsten electrode thus obtained was heated at 500° C. for about 5 hours in a stream of non-oxidizing gas, so as to debinded. The green compact was further sintered at a temperature from 1900 to 2050° C. in non-oxidizing atmosphere under a pressure of 0.1 MPa for a period of 0.1 to 20 hours so as to obtain sintered aluminum nitride.

The sintered aluminum nitride thus obtained was machined into a desired shape. Dry weight, weight in water and wet weight of the sintered aluminum nitride that had been machined were measured, and the open porosity was determined by Archimedes method. The desired gas groove (not shown) was formed on the wafer mounting surface by the sand blast method. A metal terminal for applying a voltage to the electrode was bonded by metallizing process using silver brazing.

Mean distance between the electrode and the mounting surface was measured by ultrasonic measurement method, by averaging the values measured at 5 points; one at the center and 4 points along the periphery.

After making sure that there was no crack or peel-off in the electrostatic chuck by ultrasonic inspection, repetitive voltage impression and open cycle test was conducted till insulation breakdown occurred by applying a voltage of 1 kV to the electrode 3 for 1 minute via the metal terminal 4 and removing the voltage in atmosphere of 25° C. The test was conducted by attracting the wafer (not shown) onto the wafer mounting surface 1. After the voltage impression and open cycle test, the product was cut off and photographed at a position near the electrode of the dielectric layer, at a position near the mounting surface and at a position near the mid point between the electrode and the mounting surface under SEM with magnifying power of 1000. Aluminum grain sizes were measured at 20 positions arbitrarily selected in the photographs, and were averaged to give the mean grain size. The results are shown in Table 6.

TABLE 6

| Sample No. | Mean distance between electrode and mounting surface (cm) | Product of mean distance t and specific volume resistivity R of dielectric layer ($\Omega \cdot cm^2$) | Mean grain size of dielectric layer (μm) | Open porosity of dielectric layer (%) | Number of voltage impression and open cycles before insulation breakdown |
|---|---|---|---|---|---|
| 111 | 0.015 | $1.00 \times 10^{+12}$ | 1 | 1 | 1711 |
| 112 | 0.015 | $1.00 \times 10^{+12}$ | 20 | 1 | 1499 |
| 113 | 0.015 | $1.00 \times 10^{+07}$ | 1 | 1 | 1002 |
| 114 | 0.1 | $1.00 \times 10^{+08}$ | 20 | 1 | 1400 |
| 115 | 0.014 | $1.00 \times 10^{+12}$ | 1 | 1 | 521 |
| 116 | 0.015 | $9.00 \times 10^{+06}$ | 1 | 1 | 800 |
| 117 | 0.015 | $1.00 \times 10^{+12}$ | 0.9 | 1 | 720 |
| 118 | 0.015 | $1.00 \times 10^{+12}$ | 21 | 1 | 825 |
| 119 | 0.015 | $1.00 \times 10^{+12}$ | 1 | 1.1 | 771 |

Sample No. 115 in Table 6 where mean distance between the electrode and the mounting surface was as small as 0.014 mm underwent insulation breakdown in 521 voltage impression and open cycles.

Sample No. 116, where the product of the mean distance t between the electrode and the mounting surface and the specific volume resistivity R of the dielectric layer was less than $1 \times 10^7 \, \Omega \cdot cm^2$, underwent insulation breakdown during 800th voltage impression and open cycle.

Sample where the product of the mean distance t and the specific volume resistivity R exceeded $5 \times 10^{15} \, \Omega \cdot cm^2$ (not shown in Table 1) endured 1000 voltage impression and open cycles without insulation breakdown, but could not function as an electrostatic chuck because it took too long before the equilibrium was restored from dielectric polarization, resulting in a too long time taken before it was enabled to release the wafer W.

Thus it was shown that the product of the mean distance t between the mounting surface and the electrode and the specific volume resistivity R of the dielectric layer is preferably within a range from $1 \times 10^7$ to $5 \times 10^{15} \, \Omega \cdot cm^2$.

Sample No. 117 where mean grain size of aluminum nitride was as small as 0.9 μm, less than 1 μm, underwent insulation breakdown during 720th voltage impression and open cycle.

Sample No. 118 where the mean grain size exceeded 20 μm underwent insulation breakdown during 825th voltage impression and open cycle.

Thus it was shown that the mean grain size of aluminum nitride which constitutes the dielectric layer is preferably in a range from 1 to 20 μm.

Sample No. 119 where open porosity of the dielectric layer was 1.1%, higher than 1%, underwent insulation breakdown during 771 voltage impression and open cycles.

Samples Nos. 111 through 114, where the mean distance was not less than 0.015 cm, the product (t×R) was in a range from $1 \times 10^7$ to $5 \times 10^{15} \, \Omega \cdot cm^2$, the mean grain size was in a range from 1 to 20 μm and the open porosity was not higher than 1%, were less likely to undergo insulation breakdown in 1000 or more voltage impression and open cycles, showing high performance.

EXAMPLE 7

Zero point one to 20% by weight of oxide of group 3a element was added to an aluminum nitride powder and mixed in a ball mill with IPA and urethane balls for 48 hours. The aluminum nitride slurry thus obtained was passed through a sieve of #200 mesh, so as to remove dust of balls and the inner wall of the ball mill. Then the slurry was dried in an explosion-free dryer at 120° C. for 24 hours, so as to obtain a homogeneous aluminum nitride powder. The aluminum nitride powder was mixed with a binder based on acrylic resin and a solvent thereby to prepare a slip based on aluminum nitride, which was formed into a tape by the doctor blade method.

A plurality of pieces obtained from the aluminum nitride tape were stacked and an electrode was formed from tungsten on the stack by screen printing method. A desired adhesive liquid was applied to a blank tape, and a stack of a plurality of tapes was pressed into a green compact.

The mixture green compact of aluminum nitride and tungsten electrode thus obtained was heated at 500° C. for about 5 hours in a stream of non-oxidizing gas, so as to debinder. The green compact was further sintered at a temperature from 1900 to 2050° C. in non-oxidizing atmosphere under a pressure of 0.1 MPa for a period of 0.1 to 20 hours so as to obtain sintered aluminum nitride. The electrostatic chuck was made and evaluated similarly to Example 6. The results are shown in Table 7.

with the electrostatic chuck undergoing 2700 or more voltage impression and open cycles before insulation breakdown occurred.

TABLE 7

| Sample No. | Mean distance between electrode and mounting surface (cm) | Product of mean distance t and specific volume resistivity R of dielectric layer ($\Omega \cdot cm^2$) | Metal element used as auxiliary component | Concentration of auxiliary component (%) | Mean size of grain boundary pores ($\mu m$) | Mean crystal grain size of aluminum nitride ($\mu m$) | Proportion of grain boundary pores/ proportion of in-grain pores | Open porosity (%) | Number of voltage impression and open cycles before insulation breakdown |
|---|---|---|---|---|---|---|---|---|---|
| 121 | 0.015 | $1.00 \times 10^{+10}$ | Yb | 5 | 1 | 10 | 0.1 | 0.2 | 4800 |
| 122 | 0.015 | $1.00 \times 10^{+10}$ | Yb | 5 | 5 | 10 | 0.8 | 0.5 | 4750 |
| 123 | 0.015 | $1.00 \times 10^{+10}$ | Yb | 5 | 12 | 10 | 1.1 | 0.8 | 2700 |
| 124 | 0.03 | $1.20 \times 10^{+12}$ | Y | 5 | 1 | 10 | 0.1 | 0.2 | 4950 |
| 125 | 0.03 | $1.20 \times 10^{+12}$ | Y | 5 | 5 | 10 | 0.8 | 0.5 | 4600 |
| 126 | 0.03 | $1.20 \times 10^{+12}$ | Y | 5 | 9 | 10 | 1.0 | 0.8 | 4200 |
| 127 | 0.1 | $5.00 \times 10^{+09}$ | Ce | 0.1 | 9 | 10 | 1.2 | 0.9 | 3800 |
| 128 | 0.1 | $3.00 \times 10^{+09}$ | Ce | 0.2 | 10 | 15 | 0.9 | 0.5 | 5050 |
| 129 | 0.1 | $2.00 \times 10^{+09}$ | Ce | 2 | 9 | 15 | 0.8 | 0.1 | 7090 |
| 130 | 0.1 | $1.00 \times 10^{+09}$ | Ce | 10 | 8 | 10 | 0.7 | 0.7 | 7999 |
| 131 | 0.1 | $1.00 \times 10^{+09}$ | Ce | 10 | 7 | 10 | 0.5 | 0.6 | 8200 |
| 132 | 0.1 | $5.00 \times 10^{+08}$ | Ce | 15 | 6 | 8 | 0.6 | 0.5 | 8900 |
| 133 | 0.1 | $5.00 \times 10^{+08}$ | Ce | 15 | 5 | 8 | 0.4 | 0.5 | 9800 |
| 134 | 0.1 | $5.00 \times 10^{+08}$ | Ce | 15 | 4 | 8 | 0.2 | 0.5 | 10000 or more |
| 135 | 1.1 | $1.00 \times 10^{+07}$ | Ce | 20 | 4 | 8 | 0.2 | 0.5 | 4200 |

Samples Nos. 121, 122 and 124 through 135, where the mean size of grain boundary pores was smaller than the mean crystal grain size of aluminum nitride, showed satisfactory results, with the electrostatic chuck undergoing 3800 or more voltage impression and open cycles without experiencing insulation breakdown.

Sample No. 123, where the mean size of grain boundary pores was larger than the mean crystal grain size of aluminum nitride, underwent 2700 voltage impression and open cycles, less than that described above, before insulation breakdown occurred.

Samples Nos. 121, 122, 124 through 126 and 128 through 135, where ratio Sg/Sc of the proportion Sg of the grain boundary pores to the proportion Sc of the in-grain pores in the dielectric layer was not higher than 1.0, showed more satisfactory results, with the electrostatic chuck undergoing 4200 or more voltage impression and open cycles before insulation breakdown occurred.

Samples Nos. 121 through 135 where oxides of group 3a metals such as Yb, Y, Ce, etc. were used as the auxiliary component of the dielectric layer showed satisfactory results, Samples Nos. 128 through 134, where 0.2 to 15% by weight of oxides of group 3a metal was included as the auxiliary component, showed more satisfactory results, with the electrostatic chuck undergoing 5050 or more voltage impression and open cycles before insulation breakdown occurred.

Samples Nos. 127 through 135 where Ce was used as the metallic element of the auxiliary component showed satisfactory results, with the electrostatic chuck undergoing 3800 or more voltage impression and open cycles before insulation breakdown occurred.

EXAMPLE 8

The sintered aluminum nitride was made by sintering at a temperature from 1700 to 2000° C. in non-oxidizing atmosphere under a pressure ranging from 0.1 to 300 MPa for a period of 0.1 to 20 hours. Mean grain size and open porosity of the dielectric layer were measured and evaluated similarly to Example 6.

The results are shown in Table 8.

TABLE 8

| Sample No. | Pressure of sintering atmosphere | Sintering temperature (° C.) | Duration of holding temperature (hours) | Mean distance between electrode and mounting surface (cm) | Product of mean distance t and specific volume resistivity R of dielectric layer ($\Omega \cdot cm^2$) | Mean grain size of dielectric layer ($\mu m$) | Open porosity of dielectric layer (%) | Number of voltage impression and open cycles before insulation breakdown |
|---|---|---|---|---|---|---|---|---|
| 141 | 0.2 | 1800 | 0.5 | 0.015 | $7.50 \times 10^{+07}$ | 5 | 0.5 | 2800 |
| 142 | 1 | 1800 | 10 | 0.015 | $7.50 \times 10^{+07}$ | 10 | 0.4 | 3200 |

TABLE 8-continued

| Sample No. | Pressure of sintering atmosphere | Sintering temperature (° C.) | Duration of holding temperature (hours) | Mean distance between electrode and mounting surface (cm) | Product of mean distance t and specific volume resistivity R of dielectric layer ($\Omega \cdot cm^2$) | Mean grain size of dielectric layer (μm) | Open porosity of dielectric layer (%) | Number of voltage impression and open cycles before insulation breakdown |
|---|---|---|---|---|---|---|---|---|
| 143 | 10 | 1800 | 20 | 0.015 | $7.50 \times 10^{+01}$ | 15 | 0.3 | 4080 |
| 144 | 100 | 1850 | 10 | 0.015 | $7.50 \times 10^{+01}$ | 10 | 0.2 | 5000 |
| 145 | 200 | 1900 | 1 | 0.015 | $7.50 \times 10^{+07}$ | 5 | 0.1 | 6000 |
| 146 | 0.2 | 1800 | 0.5 | 0.03 | $1.50 \times 10^{+08}$ | 5 | 0.5 | 2900 |
| 147 | 1 | 1800 | 10 | 0.03 | $1.50 \times 10^{+08}$ | 10 | 0.4 | 3000 |
| 148 | 10 | 1800 | 20 | 0.03 | $1.50 \times 10^{+08}$ | 15 | 0.3 | 4200 |
| 149 | 100 | 1850 | 10 | 0.03 | $1.50 \times 10^{+08}$ | 10 | 0.2 | 5200 |
| 150 | 200 | 1900 | 1 | 0.03 | $1.50 \times 10^{+08}$ | 5 | 0.1 | 6100 |
| 151 | 0.2 | 1800 | 0.5 | 0.10 | $5.00 \times 10^{+08}$ | 5 | 0.5 | 2700 |
| 152 | 1 | 1800 | 10 | 0.10 | $5.00 \times 10^{+08}$ | 10 | 0.4 | 3300 |
| 153 | 10 | 1800 | 20 | 0.10 | $5.00 \times 10^{+08}$ | 15 | 0.3 | 4500 |
| 154 | 100 | 1850 | 10 | 0.10 | $5.00 \times 10^{+08}$ | 10 | 0.2 | 5500 |
| 155 | 200 | 1900 | 1 | 0.10 | $5.00 \times 10^{+08}$ | 5 | 0.1 | 6500 |

In samples Nos. 141 through 155 where the sintered aluminum nitride was made by sintering at a temperature from 1800 to 1900° C. in non-oxidizing atmosphere under a pressure from 0.2 to 200 MPa for a period of 0.2 to 20 hours, mean grain size of the sintered aluminum nitride could be controlled within a range from 5 to 15 μm and the open porosity was controlled not higher than 0.5%, thereby showing satisfactory results, with the electrostatic chuck undergoing 2700 or more voltage impression and open cycles.

INDUSTRIAL APPLICABILITY

The present invention provides an epoch making electrostatic chuck which does not undergo insulation breakdown when used repetitively, for use in a film forming apparatus such as CVD, PVD, sputtering, SOD, SOG, etc. and in an etching apparatus in the semiconductor manufacturing process.

The invention claimed is:

1. An electrostatic chuck comprising:
a plate-like member having a pair of main surfaces, one of the main surfaces serving as a wafer mounting surface; and
an electrostatic attraction electrode provided on the other main surface of the plate-like member or inside of the plate-like member,
the plate-like member comprising at least one gas introducing through-hole formed so as to penetrate through the plate-like member, a gas flow passage for communicating with the through-hole, being formed between a plurality of protrusions disposed at distance from each other on the mounting surface, and a ring-shaped wall formed along the periphery of the plate-like member,
wherein each of the protrusions has a planar configuration comprising four sides and four arced corners connecting the four sides, and all the protrusions are disposed substantially evenly on the mounting surface,
wherein the plate-like member is made of a dielectric material containing aluminum nitride as a main component, mean distance between the electrode and the wafer mounting surface is 0.015 cm or more, the product of the mean distance and specific volume resistivity of the dielectric layer sandwiched by the mounting surface and the electrode is in a range from $1 \times 10^7$ to $5 \times 10^{16}$ $\Omega \cdot cm^2$, mean grain size of aluminum nitride used in forming the dielectric layer is in a range from 1 to 20 μm and an open porosity in the dielectric layer is 1% or less.

2. The electrostatic chuck according to claim 1, wherein the protrusions are disposed in a grating pattern on the mounting surface.

3. The electrostatic chuck according to claim 1, wherein portions connecting a bottom surface of the gas flow passage with the protrusions or the ring-shaped wall are formed to be arced.

4. The electrostatic chuck according to claim 1, wherein an arithmetic mean surface roughness Ra of the bottom surface of the gas flow passage is 2 μm or less.

5. The electrostatic chuck according to claim 1, wherein a width of the ring-shaped wall is from 0.5 to 10 mm, distance between opposing sides of the protrusion is from 1.5 to 10 mm, total area of the top surfaces of the protrusions and of the ring-shaped wall is from 50 to 80% of the area of the mounting surface, and the height of the protrusion from a bottom surface of the gas flow passage is from 10 to 100 μm.

6. The electrostatic chuck according to claim 1, wherein one through-hole is provided at the center of the mounting surface and more than one through-hole is provided on a concentric circle about the center of the mounting surface.

7. The electrostatic chuck according to claim 1, further comprising an inner ring-shaped wall located inside the ring-shaped wall, wherein a plurality of through-holes are provided between the ring-shaped wall and the inner ring-shaped wall, and through-holes are provided inside the inner ring-shaped wall.

8. The electrostatic chuck according to claim 1, wherein that maximum diameter of the plate-like member is from 180 to 500 mm, and the number of the through-holes is from 4 to 100 each measuring 0.1 to 5 mm in diameter.

9. The electrostatic chuck according to claim 1, wherein a heat exchanger is installed on the other main surface of the plate-like member.

10. The electrostatic chuck according to claim 9, wherein the heat exchanger is constituted from a metal plate.

11. The electrostatic chuck according to claim 1, wherein the plate-like member is made of a sintered material comprising alumina or aluminum nitride as a main component.

12. The electrostatic chuck according to claim 1, wherein the dielectric layer includes pores located in crystal grains and pores located in grain boundaries, and wherein mean size of the grain boundary pores is smaller than the mean crystal grain size of aluminum nitride.

13. The electrostatic chuck according to claim 1, wherein a ratio Sg/Sc of a proportion Sg of the grain boundary pores to a proportion Sc of the in-grain pores in the dielectric layer is not higher than 1.0.

14. The electrostatic chuck according to claim 1, wherein the dielectric layer is containing aluminum nitride as a main component and 0.2 to 15% by weight of oxide of group 3a metal element is included as an auxiliary component.

15. The electrostatic chuck according to claim 14, wherein the group 3a metal is cerium.

16. The electrostatic chuck according to claim 1, wherein the plate-like ceramic member made of aluminum nitride is formed by sintering at a temperature from 1800 to 1900° C. in non-oxidizing atmosphere of 0.2 to 200 MPa for a period of 0.5 to 20 hours.

* * * * *